United States Patent
Kim et al.

(10) Patent No.: US 9,865,495 B2
(45) Date of Patent: Jan. 9, 2018

(54) SEMICONDUCTOR DEVICE AND METHOD FOR FABRICATING THE SAME

(71) Applicant: Samsung Electronics Co., Ltd., Suwon-si, Gyeonggi-do (KR)

(72) Inventors: Ki-Il Kim, Suwon-si (KR); Gi-Gwan Park, Seoul (KR); Jung-Gun You, Ansan-si (KR); Hyung-Dong Kim, Seongnam-si (KR); Sug-Hyun Sung, Yongin-si (KR); Myung-Yoon Um, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/220,094

(22) Filed: Jul. 26, 2016

(65) Prior Publication Data

US 2017/0133264 A1 May 11, 2017

Related U.S. Application Data

(60) Provisional application No. 62/251,297, filed on Nov. 5, 2015.

(30) Foreign Application Priority Data

Dec. 11, 2015 (KR) .................. 10-2015-0176742

(51) Int. Cl.
*H01L 21/76* (2006.01)
*H01L 21/762* (2006.01)
*H01L 29/66* (2006.01)
*H01L 29/06* (2006.01)
*H01L 29/78* (2006.01)
*H01L 27/11* (2006.01)

(52) U.S. Cl.
CPC .... *H01L 21/76229* (2013.01); *H01L 27/1104* (2013.01); *H01L 29/0653* (2013.01); *H01L 29/66795* (2013.01); *H01L 29/7843* (2013.01); *H01L 29/7853* (2013.01)

(58) Field of Classification Search
CPC ......... H01L 21/76229; H01L 29/66795; H01L 29/0653; H01L 27/1116; H01L 29/7843; H01L 27/1104; H01L 29/7853
USPC ........................................................ 438/438
See application file for complete search history.

(56) References Cited

U.S. PATENT DOCUMENTS 5,360,753 A * 11/1994 Park .................. H01L 21/76202
257/E21.55
6,171,928 B1  1/2001 Lou
6,465,866 B2 10/2002 Park et al.
(Continued)

Primary Examiner — Vu A Vu
(74) Attorney, Agent, or Firm — Myers Bigel, P.A.

(57) ABSTRACT

A method of fabricating a semiconductor device includes forming a plurality of mask patterns comprising a real mask pattern and a dummy mask pattern on a substrate, removing the dummy mask pattern and etching the substrate using the real mask pattern as a mask to form a first trench, a second trench, and a fin-type pattern defined by the first trench and the second trench. The second trench contacting the fin-type pattern comprises a smooth pattern which is convex and positioned between a bottom surface and a side surface of the second trench, a first concave portion which is positioned between the side surface of the second trench and the smooth pattern, and a second concave portion which is positioned between the convex portion and the bottom surface of the second trench.

24 Claims, 25 Drawing Sheets

(56) References Cited

U.S. PATENT DOCUMENTS

| | | | |
|---|---|---|---|
| 6,750,117 | B1 | 6/2004 | Hung et al. |
| 6,849,919 | B2 * | 2/2005 | Sumino ............ H01L 21/76229 257/506 |
| 6,864,152 | B1 * | 3/2005 | Mirbedini ......... H01L 21/76229 257/E21.548 |
| 7,589,391 | B2 | 9/2009 | Ohta et al. |
| 8,637,934 | B2 | 1/2014 | Kim et al. |
| 2001/0021567 | A1 | 9/2001 | Takahashi |
| 2002/0003275 | A1 | 1/2002 | Lee et al. |
| 2015/0243502 | A1 | 8/2015 | Wang et al. |
| 2015/0243505 | A1 | 8/2015 | Wang et al. |
| 2015/0243659 | A1 | 8/2015 | Huang et al. |
| 2015/0255542 | A1 | 9/2015 | Cai et al. |
| 2015/0255576 | A1 | 9/2015 | Liao et al. |
| 2015/0255594 | A1 | 9/2015 | Zhu et al. |
| 2015/0263159 | A1 | 9/2015 | Ching et al. |

* cited by examiner

SEMICONDUCTOR DEVICE AND METHOD FOR FABRICATING THE SAME

CLAIM OF PRIORITY

This application claims priority from Korean Patent Application No. 10-2015-0176742 filed on Dec. 11, 2015 in the Korean Intellectual Property Office, and U.S. Provisional Patent Application No. 62/251,297 filed on Nov. 5, 2015, and all the benefits accruing therefrom under 35 U.S.C. 119, the contents of which are incorporated by reference herein in their entireties.

BACKGROUND

The present disclosure relates to semiconductor devices and methods for fabricating the same.

Multi-gate transistors may be one of several possible scaling technologies that can be used to increase the density of semiconductor devices. In multi-gate transistors, silicon bodies in a fin or nanowire shape may be formed on a substrate, with gates being formed on surfaces of the silicon bodies.

Such multi-gate transistors can be more easily scaled, as they may use a three-dimensional channel. Further, current control capability can be enhanced without increasing the gate lengths of the multi-gate transistors. Furthermore, may be possible to effectively suppress short channel effect (SCE), which may refer to a phenomenon whereby the electric potential of the channel region is influenced by the drain voltage.

SUMMARY

Some embodiments of the present disclosure to provide semiconductor devices with improved operating characteristics.

Some embodiments of the present disclosure to provide methods for fabricating semiconductor devices with improved operating characteristics.

Embodiments according to the present disclosure are not limited to those set forth above and objects other than those set forth above will be clearly understood to those skilled in the art from the following description.

According to some embodiments of the present inventive concepts, a method of fabricating a semiconductor device includes forming mask patterns on a substrate, and performing an etch process. The etch process includes selectively removing at least one of the mask patterns to define a preliminary trench in the substrate adjacent remaining ones of the mask patterns without removing the substrate between the remaining ones of the mask patterns, such that edges of the preliminary trench define sharp patterns, and etching the substrate between the remaining ones of the mask patterns to define fin-type patterns protruding from the substrate and a shallow trench therebetween. The etching dulls the sharp patterns and increases a depth of the preliminary trench to further define a deep trench in the substrate adjacent one of the fin-type patterns. Responsive to performing the etch process, the method further includes forming device isolating patterns in the shallow trench and in the deep trench.

In some embodiments, responsive to performing the etch process, a portion of the substrate between a sidewall of the one of the fin-type patterns and a bottom surface of the deep trench may define a convex pattern.

In some embodiments, responsive to performing the etch process, a portion of the substrate between the sidewall of the one of the fin-type patterns and the convex pattern may define a first concave pattern, and a portion of the substrate between the convex pattern and the bottom surface of the deep trench may define a second concave pattern.

In some embodiments, the etching the substrate between the remaining ones of the mask patterns may include sequentially performing a first etch and performing a second etch. The first etch may define a preliminary shallow trench between the remaining ones of the mask patterns and may increase the depth of the preliminary trench to define a preliminary deep trench having the sharp patterns dulled at edges thereof. The second etch may increase respective depths of the preliminary shallow trench and the preliminary deep trench to define the shallow trench and the deep trench, respectively, such that the deep trench includes the first concave pattern, the convex pattern, and the second concave pattern in the portions of the substrate, respectively.

In some embodiments, responsive to performing the etch process, the shallow trench between the fin-type patterns may be free of a convex pattern.

In some embodiments, the mask patterns may be first mask patterns on a first region of the substrate, and the fin-type patterns and the shallow trench may be first fin-type patterns and a first shallow trench, respectively. Prior to performing the etch process, the method may further include forming second mask patterns on a second region of the substrate adjacent the first region, such that the first and second mask patterns are spaced with a uniform pitch therebetween, selectively etching the second region of the substrate using the second mask patterns as a mask to define second fin-type patterns therein having a second shallow trench therebetween, and forming a first device isolating film in the second shallow trench. The second shallow trench may have a same depth as the first shallow trench.

In some embodiments, the deep trench may be a first deep trench in the first region of the substrate. The method may further include forming a second deep trench in the second region of the substrate adjacent one of the second fin-type patterns such that a portion of the substrate between a sidewall of the one of the second fin-type patterns and a bottom surface of the second deep trench defines a sharp pattern, and forming a second device isolating film on the sharp pattern in the second deep trench. The second deep trench may have a greater depth than the first deep trench, and the sharp pattern may protrude away from the bottom surface of the second deep trench and beyond the convex pattern.

In some embodiments, the device isolating patterns in the shallow trench and the deep trench may be portions of a same low-k device isolating film.

According to an aspect of the present inventive concepts, a method for fabricating a semiconductor device includes forming a plurality of mask patterns comprising a real mask pattern and a dummy mask pattern on a substrate, removing the dummy mask pattern and etching the substrate using the real mask pattern as a mask to form a first trench, a second trench, and a fin-type pattern defined by the first trench and the second trench, wherein the second trench contacting the fin-type pattern comprises a smooth pattern which is convex upward and positioned between a bottom surface and a side surface of the second trench, a first concave portion which is convex downward and positioned between the side surface of the second trench and the smooth pattern, and a second concave portion which is convex downward and positioned between the convex portion and the bottom surface of the second trench.

According to another aspect of the present inventive concepts, a method for fabricating a semiconductor device includes forming a mask pattern having a predetermined pitch on a substrate, wherein the mask pattern comprises a real mask pattern and a dummy mask pattern, removing the dummy mask pattern to form a pre-second trench and a sharp pattern protruding between the pre-deep trench and the real mask pattern and etching the substrate using the real mask pattern as a mask to form a first trench, a second trench formed by increasing a depth of the pre-second trench, and a smooth pattern formed by increasing a smoothness of a surface of the sharp pattern.

According to still another aspect of the present inventive concepts, a method for fabricating a semiconductor device includes forming a first mask pattern and a second mask pattern on first and second regions on a substrate, respectively, wherein the first mask pattern comprises a real mask pattern and a dummy mask pattern, respectively, etching the substrate using the second mask pattern as a mask in the second region to form a second first trench and a second fin-type pattern defined by the second first trench, wherein the second fin-type pattern comprises a real fin-type pattern and a dummy fin-type pattern, removing the dummy mask pattern, forming a first trench, a first second trench, and a first fin-type pattern defined by the first trench and the first second trench using the real mask pattern as a mask and removing the dummy fin-type pattern to form a second trench.

According to an aspect of the present inventive concepts, a semiconductor device includes a first fin-type pattern protruding further than a substrate and comprising a first side surface and a second side surface opposed to each other, a first trench formed on the first side surface, a second trench formed on the second side surface and wider than the first trench and a smooth pattern which is convex upward formed between a bottom surface of the second trench and a side surface of the first fin-type pattern.

According to another aspect of the present inventive concepts, a semiconductor device includes a substrate comprising a first region and a second region, in the first region, a first fin-type pattern protruding further than the substrate, in the second region, a second fin-type pattern protruding further than the substrate, in the first region, a first deep trench contacting the first fin-type pattern, in the second region, a second deep trench contacting the second fin-type pattern, a smooth pattern protruding upward between a bottom surface of the first deep trench and the first fin-type pattern, wherein a slope of an upper surface of the smooth pattern is continuous and a sharp pattern protruding upward between the bottom surface of the second deep trench and the second fin-type pattern, wherein a slope of an upper surface of the sharp pattern is discontinuous.

BRIEF DESCRIPTION OF THE DRAWINGS

The above and other features and advantages of the present disclosure will become more apparent to those of ordinary skill in the art by describing in detail example embodiments thereof with reference to the accompanying drawings, in which.

DETAILED DESCRIPTION

Figure 1:
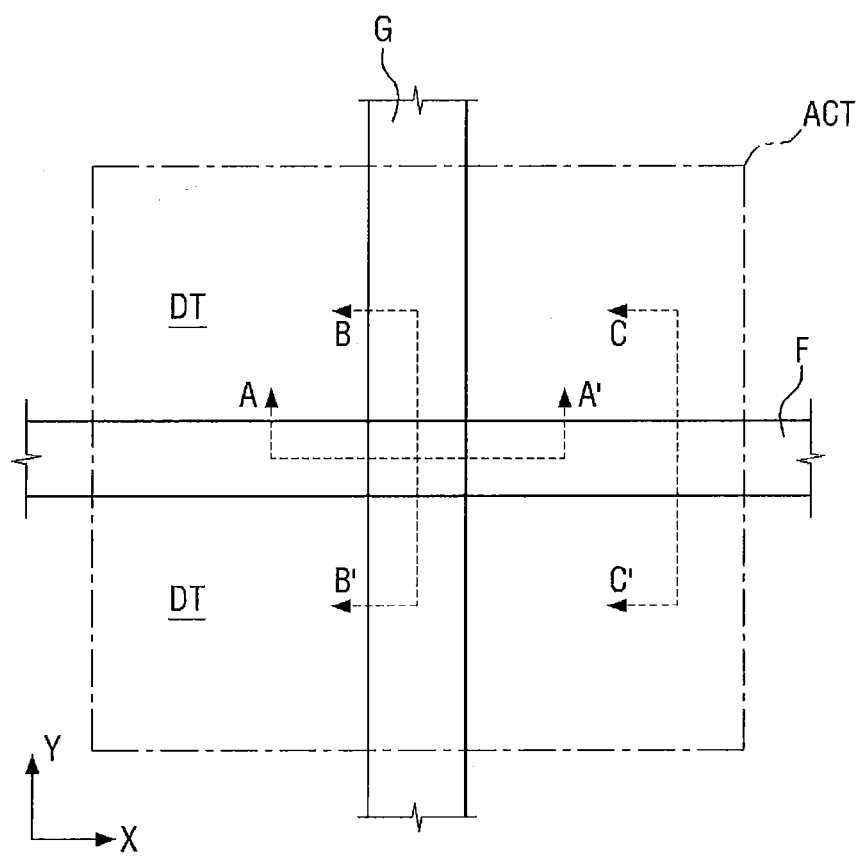
FIG. 1 is a layout diagram provided to explain semiconductor devices according to some example embodiments.

The present inventive concepts will now be described more fully hereinafter with reference to the accompanying drawings, in which embodiments of the inventive concepts are shown. These inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions is exaggerated for clarity.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof. The term "and/or" includes any and all combinations of one or more of the associated listed items.

Spatially relative terms, such as "beneath," "below," "lower," "above," "upper," and the like, may be used herein for ease of description to describe one element's or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present inventive concept.

It will also be understood that when an element is referred to as being "on" or "connected to" another element, it can be directly on or connected to the other element, or intervening elements may be present. In contrast, when an element is referred to as being "directly on" or "directly connected to" another element, there are no intervening elements present. It will also be understood that the sizes and relative orientations of the illustrated elements are not shown to scale, and in some instances they have been exaggerated for purposes of explanation.

Embodiments are described herein with reference to cross-sectional and/or perspective illustrations that are schematic illustrations of idealized embodiments (and intermediate structures). As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the present inventive concept.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, semiconductor devices according to some example embodiments will be described with reference to FIGS. 1 to 4.

Figure 2:
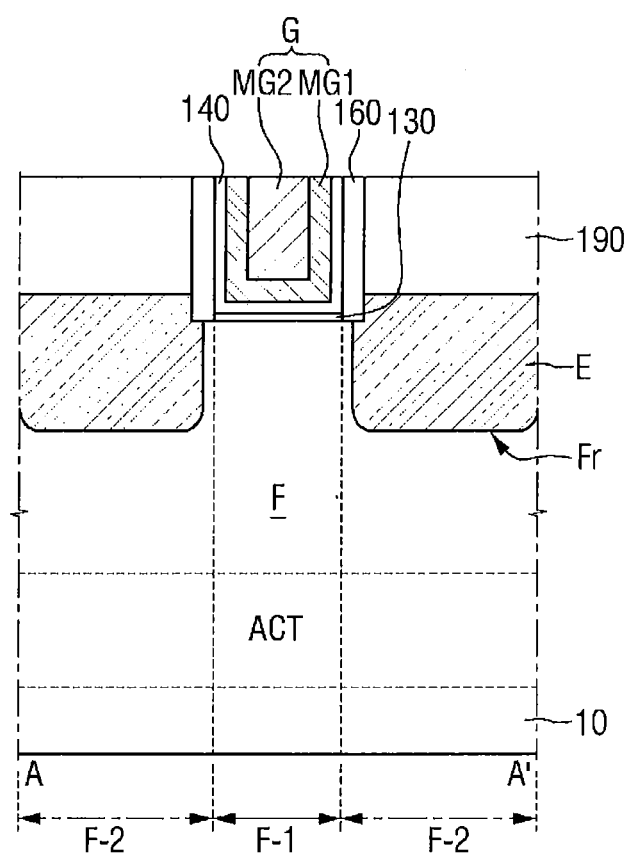
FIG. 2 is a cross sectional view taken on line A-A' of FIG. 1.
Figure 3:
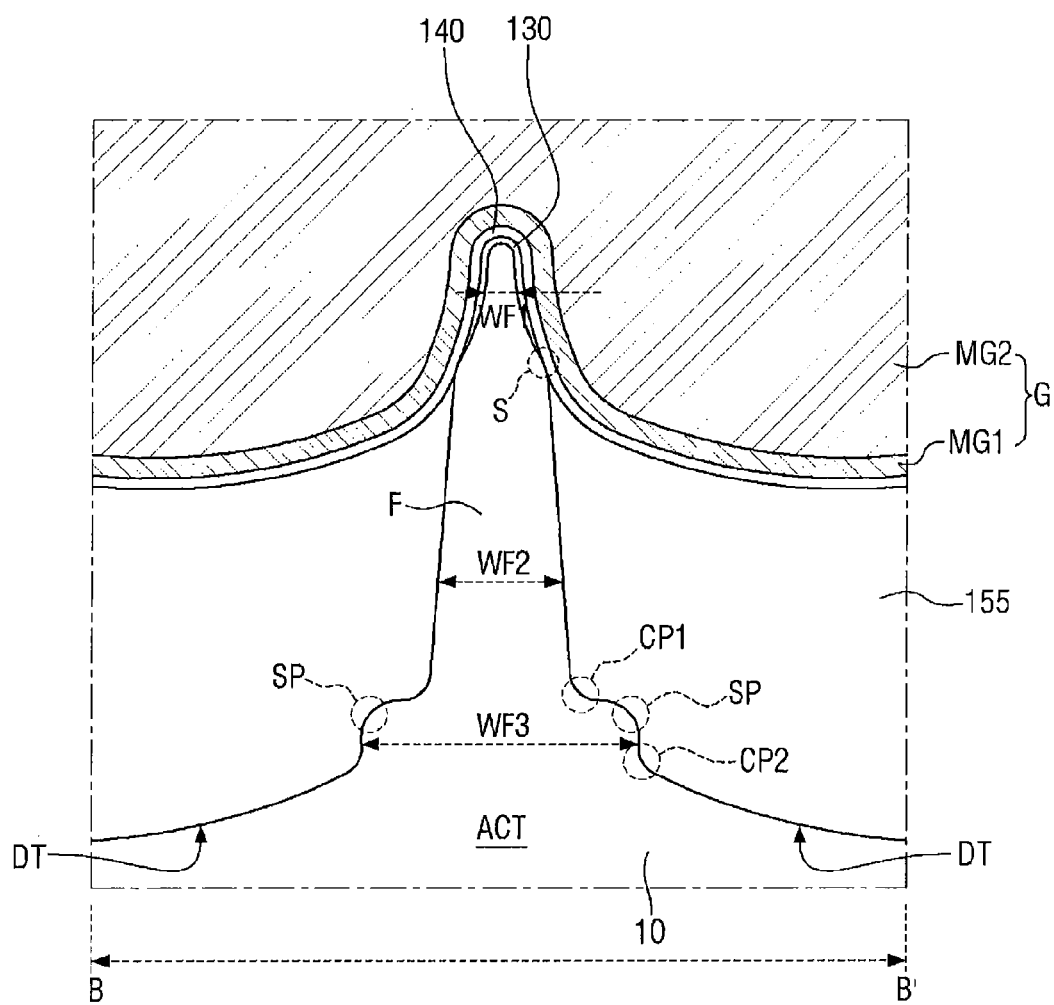
FIG. 3 is a cross sectional view taken on line B-B' of FIG. 1.
Figure 4:
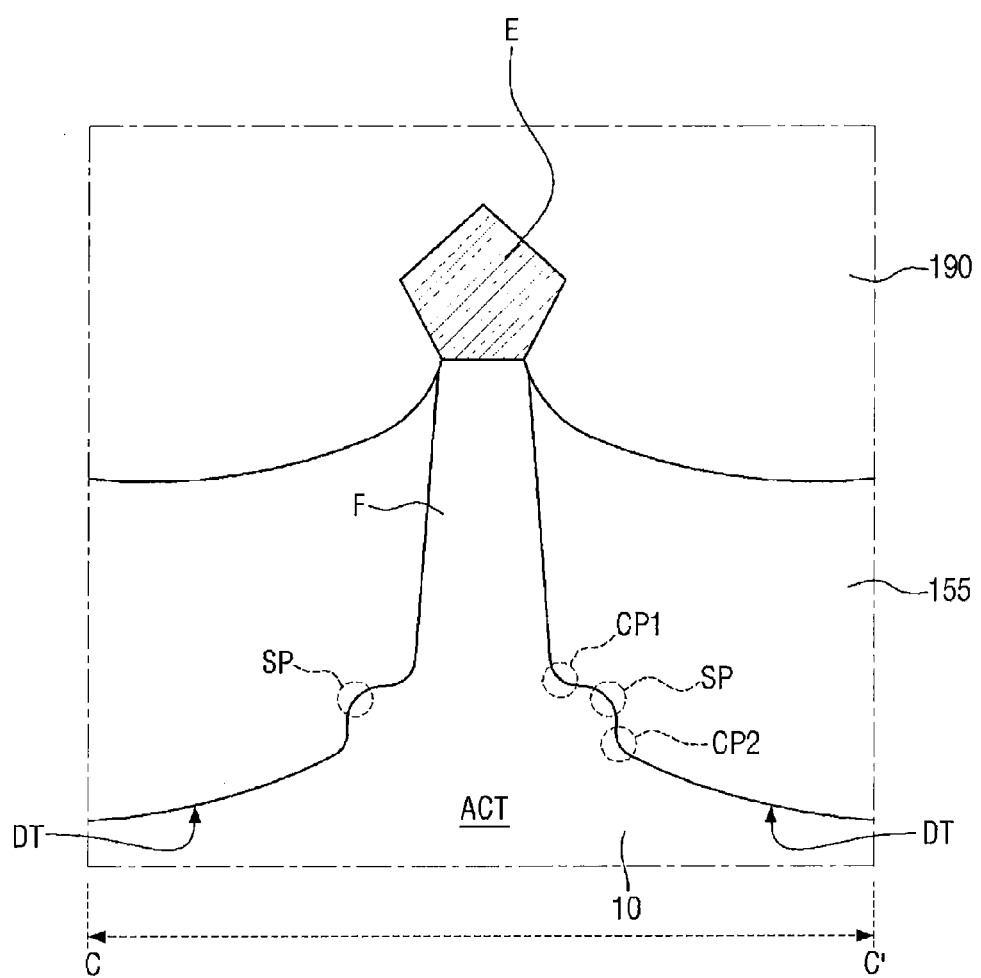
FIG. 4 is a cross sectional view taken on line C-C' of FIG. 1.

FIG. 1 is a layout diagram provided to explain semiconductor devices according to some example embodiments, and FIG. 2 is a cross sectional view taken on line A-A' of FIG. 1. FIG. 3 is a cross sectional view taken on line B-B' of FIG. 1, and FIG. 4 is a cross sectional view taken on line C-C' of FIG. 1.

Referring to FIGS. 1 to 4, semiconductor devices according to some example embodiments may include a substrate 10, a fin-type pattern F, a deep trench DT, a device isolating film 155, an interlayer insulating film 190, a gate electrode G, gate insulating films 130, 140, a gate spacer 160, a source/drain E, etc.

The substrate 10 may for example be bulk silicon or silicon-on-insulator (SOI). The substrate 10 may be a silicon substrate, or may include other material such as silicon germanium, indium antimonide, lead telluride compound, indium arsenide, indium phosphide, gallium arsenide, or gallium antimonide. The substrate 10 may be a base substrate having an epitaxial layer formed thereon.

The fin-type pattern F may extend longitudinally in a first direction X. As illustrated in FIG. 1, the fin-type pattern F may have a rectangular shape, although example embodiments are not limited thereto. When the fin-type pattern F is in a rectangular shape, the fin-type pattern F may include long sides extending in the first direction X and short sides extending in a second direction Y. In this case, the second direction Y may be the direction that is not parallel to, but intersects the first direction X.

The fin-type pattern F may be defined by the deep trench DT. Specifically, deep trenches DT may be formed on opposite sides of the fin-type pattern F in the first direction X. That is, the deep trenches DT may be in contact with the fin-type pattern F in opposite directions each other with reference to the fin-type pattern F. Depths of the deep trenches DT formed on the opposite sides of the fin-type pattern F may be equal to each other.

The fin-type pattern F may be formed by etching a portion of the substrate 10, and may include an epitaxial layer grown on the substrate 10. The fin-type pattern F may include a single-element semiconductor material such as silicon or germanium, for example. Further, the fin-type pattern F may include a compound semiconductor such as, for example, IV-IV group compound semiconductor or III-V group compound semiconductor.

For example, for IV-IV group compound semiconductors, the fin-type pattern F may be a binary compound or a ternary compound including two or more of carbon (C), silicon (Si), germanium (Ge) or tin (Sn), or these compounds doped with IV group element.

For III-V group compound semiconductors, the fin-type pattern F may be one of a binary compound, a ternary compound or a quaternary compound which is formed by a combination of a III group element which may be at least one of aluminum (Al), gallium (Ga), or indium (In), with a V group element which may be one of phosphorus (P), arsenic (As) or antimony (Sb).

In the following description, it is assumed that the fin-type pattern F of semiconductor devices according to example embodiments includes silicon.

The device isolating film 155 may fill a portion of the deep trench DT. The device isolating film 155 may surround a portion of a side surface of the fin-type pattern F.

For example, the device isolating film 155 may include at least one of silicon oxide, silicon nitride, silicon oxynitride, or a low-k dielectric material with a smaller dielectric constant than silicon oxide. For example, the low-k dielectric material may include flowable oxide (FOX), Tonen silazen (TOSZ), undoped silica glass (USG), borosilicate glass (BSG), phosphosilicate glass (PSG), borophosphosilicate glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or combinations thereof, but not limited thereto.

The device isolating film 155 may have a specific stress characteristic. That is, the device isolating film 155 may have a tensile stress characteristic as its volume is shrunken by a heat process after deposition.

An active region ACT may include the fin-type pattern F. The active region ACT may include a portion of the deep trenches DT positioned on opposite sides of the fin-type pattern F.

The gate electrode G may extend in the second direction Y. The gate electrode G may be on the fin-type pattern F, intersecting with the fin-type pattern F. That is, the gate electrode G may include a portion overlapping with the fin-type pattern F. The fin-type pattern F may include a portion overlapping with, and a portion non-overlapping with the gate electrode G, respectively.

Referring to FIGS. 1 and 2, for example, the fin-type pattern F may include a first portion F-1 overlapping with the gate electrode G, and a second portion F-2 non-overlapping with the gate electrode G. The second portion F-2 of the fin-type pattern F may be disposed on opposite sides in the first direction X with reference to the first portion F-1 of the fin-type pattern F at a center.

Referring to FIGS. 2 and 3, the gate electrode G may include a work function metal MG1 and a fill metal MG2. The work function metal MG1 plays a role of adjusting a work function, and the fill metal MG2 plays a role of filling the space formed by the work function metal MG1. The work function metal MG1 may be, for example, an N-type work function metal, a P-type work function metal, or combinations thereof.

In some example embodiments, the active region ACT including the gate electrode G may be an N-type region, and therefore the work function metal MG1 may be an N-type work function metal. For example, the work function metal MG1 may include at least one of, for example, TiN, WN, TiAl, TiAlN, TaN, TiC, TaC, TaCN, TaSiN, or combinations thereof, but not limited thereto. Further, the fill metal MG2 may include at least one of, for example, W, Al, Cu, Co, Ti, Ta, poly-Si, SiGe, or a metal alloy, but not limited thereto.

In contrast, in some example embodiments, the active region ACT including the gate electrode G may be a P-type region, and therefore the work function metal MG1 may be a combination of an N-type work function metal and a P-type work function metal. For example, the work function metal MG1 may include at least one of, for example, TiN, WN, TiAl, TiAlN, TaN, TiC, TaC, TaCN, TaSiN, or combinations thereof, but not limited thereto. Further, the fill metal MG2 may include at least one of, for example, W, Al, Cu, Co, Ti, Ta, poly-Si, SiGe, or a metal alloy, but not limited thereto.

For example, the gate electrode G described above may be formed by replacement process or gate last process, but not limited thereto.

The gate insulating films 130, 140 may be formed between the fin-type pattern F and the gate electrode G, and between the device isolating film 155 and the gate electrode G. The gate insulating films 130, 140 may include an interfacial layer 130 and a high-k dielectric film 140.

The interfacial layer 130 may be formed by oxidizing a portion of the fin-type pattern F. The interfacial layer 130 may be formed along a profile of the fin-type pattern F protruding upward higher than an upper surface of the device isolating film 155. When the fin-type pattern F is a silicon fin-type pattern including silicon, the interfacial layer 130 may include a silicon oxide film.

As illustrated in FIG. 3, the interfacial layer 130 may not be formed along the upper surface of the device isolating film 155, but example embodiments are not limited thereto. Depending on methods of forming the interfacial layer 130, the interfacial layer 130 may be formed along the upper surface of the device isolating film 155.

Additionally or alternatively, even when the device isolating film 155 includes silicon oxide, the interfacial layer 130 may be formed along the upper surface of the device isolating film 155 if the silicon oxide included in the device isolating film 155 has different properties from the silicon oxide film included in the interfacial layer 130.

The high-k dielectric film 140 may be formed between the interfacial layer 130 and the gate electrode G. The high-k dielectric film 140 may be formed along a profile of the fin-type pattern F protruding upward higher than the upper surface of the device isolating film 155. Further, the high-k dielectric film 140 may be formed between the gate electrode G and the device isolating film 155.

The high-k dielectric film 140 may include a high-k dielectric material having a higher dielectric constant than silicon oxide. For example, the high-k dielectric film 140 may include one or more of silicon oxynitride, silicon nitride, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, but not limited thereto.

The gate spacer 160 may be disposed on sidewalls of the gate electrode G extending in the second direction Y. The gate spacer 160 may include, for example, at least one of silicon nitride (SiN), silicon oxynitride (SiON), silicon oxide ($SiO_2$), silicon oxycarbonitride (SiOCN), or combinations thereof.

As illustrated in the drawings, the gate spacer 160 may be a single film as an example, but it may be multiple spacers in which a plurality of films are stacked. A shape of the gate spacer 160 and respective shapes of the multiple spacers forming the gate spacer 160 may be an I- or L-shape, or combinations thereof depending on the fabrication process and purpose of use.

Referring to FIG. 2, source/drains E may be formed on the fin-type pattern F, that is, on opposite sides of the gate electrode G in the first direction X, respectively. The source/drains E may be formed on the fin-type pattern F, respectively. For example, the source/drains E may be formed on the second portion F-2 of the fin-type pattern F.

The source/drains E may include an epitaxial layer formed by epitaxy. Further, the second source/drains E may be a raised source/drain. For example, the source/drains E may be SiGe epitaxial layers or Si epitaxial layers. However, example embodiments are not limited to the example given above. The source/drains E may fill recesses Fr formed in the second portions F-2 of the fin-type pattern F.

When semiconductor devices according to an example embodiment is an N-type transistor in the active region ACT, the source/drains E may include a tensile stress material. For example, when the fin-type pattern F is silicon, the source/drains E may include a material (e.g., SiC) that has a smaller lattice constant than silicon. For example, the tensile stress material can enhance carrier mobility in the channel region by exerting tensile stress on the fin-type pattern F.

The interlayer insulating film 190 may overlay the fin-type pattern F, the source/drains E, the gate electrode G, etc. The interlayer insulating film 190 may be formed on the device isolating film 155.

For example, the interlayer insulating film 190 may include at least one of silicon oxide, silicon nitride, silicon oxynitride, or a low-k dielectric material with a smaller dielectric constant than silicon oxide. For example, the low-k dielectric material may include flowable oxide (FOX), Tonen silazen (TOSZ), undoped silica glass (USG), borosilicate glass (BSG), phosphosilicate glass (PSG), borophosphosilicate glass (BPSG), plasma enhanced tetra ethyl ortho silicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or combinations thereof, but not limited thereto.

When semiconductor devices according to an example embodiment is a P-type transistor in the active region ACT, the source/drains E may include a compressive stress material. For example, the compressive stress material may be a material such as SiGe that has a larger lattice constant compared to Si. For example, the compressive stress material can enhance carrier mobility in the channel region by exerting compressive stress on the fin-type pattern F.

The fin-type pattern F may include a stepped portion S and a smooth pattern SP.

Specifically, the fin-type pattern F may be separated into a lower portion and an upper portion by the stepped portion S. That is, the lower portion of the fin-type pattern F may be defined to be a portion of the fin-type pattern F protruding from the substrate 10, up to the stepped portion S thereof. Likewise, the upper portion of the fin-type pattern F may be defined to be the portion spanning from the stepped portion S to the uppermost portion of the fin-type pattern F. A width WF2 of the lower portion of the fin-type pattern F may be greater than a width WF1 of the upper portion of the fin-type pattern F.

The expression 'stepped portion' as used herein refers to a point or area at which a decreasing slope of the surface turns into an increasing slope, or a point or area at which an increasing slope of the surface turns into a decreasing slope. That is, the 'stepped portion' as used herein may refer to concept that includes a point of inflection of the profile of the surface. In other words, the 'stepped portion' as used herein may refer to a point or area at which the profile of the surface turns from convex upward into convex downward, or a point or area at which the profile of the surface turns from the convex downward into convex upward. That is, the 'stepped portion' refers to a point or area at which the sign of changes of the slope of the profile is changed.

Accordingly, the stepped portion S may be a point or area at which the sign of changes of the slope of the side surface profile of the fin-type pattern F is changed. That is, the stepped portion S may be a point or area at which the side surface profile of the fin-type pattern F changes from convex upward into convex downward, or from convex downward into convex upward.

The lower portion of the fin-type pattern F may be in contact with the device isolating film 155. The device isolating film 155 may surround the lower portion of the fin-type pattern F on opposite sides of the fin-type pattern F. The upper portion of the fin-type pattern F may be surrounded by the gate insulating films 130, 140.

A width of the lower portion of the fin-type pattern F may increase with decreasing distance from the substrate 10. That is, a width of the lower portion of the fin-type pattern F may decrease with increasing distance from the substrate 10.

The smooth pattern SP may be formed between a bottom surface and a side surface of the deep trench DT. That is, the smooth pattern SP may be formed between a bottom surface of the deep trench DT and a side surface or sidewall of the fin-type pattern F. The smooth pattern SP may be formed to be convex upward between a bottom surface and a side surface of the deep trench DT. Specifically, the smooth pattern SP may also be formed to be convex outward of the fin-type pattern F. That is, the smooth pattern SP may be formed to be a convex pattern extending diagonally upward and outward relative to the fin-type pattern F.

Since the smooth pattern SP may be formed convex in a direction relative to a side surface of the fin-type pattern F, a width WF3 of the fin-type pattern F at a portion where the smooth pattern SP is formed may be greater than a width WF2 of the lower portion of the fin-type pattern F and a width WF1 of the upper portion of the fin-type pattern F.

An upper surface of the smooth pattern SP may be formed in a curved shape. That is, a slope of the upper surface of the smooth pattern SP may be continuous or continuously varying. The smooth pattern SP may be formed while a sharp portion formed in the cutting process of the fin-type pattern is polished by several etch processes. The sharp portion may include a portion in which a slope of the upper surface is discontinuous. With the etch process, the portion in which a slope of the upper surface is discontinuous may be removed, and then a slope of the upper surface of the smooth pattern SP may be continuous overall.

A first concave portion CP1 may be formed between the smooth pattern SP and a side surface of the fin-type pattern F. The first concave portion CP1 may be a convex shape or pattern extending inwardly and downwardly relative to the fin-type pattern F. That is, the first concave portion CP1 may be a depressed shape diagonally in inward and downward. The lower surface of the first concave portion CP1 may be higher than the bottom surface of the deep trench DT.

A slope of the upper surface of the first concave portion CP1 may be continuous. That is, the first concave portion CP1 may also be polished into a curved surface through several etch processes. The slope of the upper surface connecting the first concave portion CP1 with the smooth pattern SP may also be continuous.

A second concave portion CP2 may be formed between the smooth pattern SP and the bottom surface of the deep trench DT. The second concave portion CP2 may be in a convex shape or pattern extending inward and downward relative to the fin-type pattern F. That is, the second concave portion CP2 may be in a shape depressed diagonally in an inward and downward direction. The lower surface of the second concave portion CP2 may be formed lower than the lower surface of the first concave portion CP1.

A slope of the upper surface of the second concave portion CP2 may be continuous. That is, the second concave portion CP2 may also be polished into a curved surface through several etch processes. A slope of the upper surface connecting the second concave portion CP2 with the smooth pattern SP may also be continuous.

Accordingly, slopes of the upper surfaces connecting the first concave portion CP1, the smooth pattern SP, and the second concave portion CP2 with each other may be continuous overall. That is, as used herein, the expression "continuous" may include a slope discontinuity or discontinuities generated by micro defects on the surface.

The smooth pattern SP may be formed on a portion where the fin-type pattern F is in contact with the deep trench DT, that is, at an interface between or intersection of a sidewall of the fin pattern F and the bottom of the deep trench DT. Referring to FIG. 3, since the deep trench DT may be formed on opposite side surfaces of the fin-type pattern F, the smooth pattern SP may also be formed on opposite side surfaces of the fin-type pattern F.

In semiconductor devices according to some example embodiments, a sharp portion formed between the bottom of the deep trench DT and the side surface of the fin-type pattern F may be formed smooth. If the sharp pattern remains in its shape, it may act as a ghost fin-type pattern. As used herein, the term "ghost fin-type pattern" refers to a problematic presence of remaining portions of one or more fin-type patterns which were intended to be removed. Specifically, when the ghost fin-type pattern is formed, an epitaxial layer may also be grown on the ghost fin-type pattern during forming of the source/drains E, possibly causing short with the source/drains E and electrically affecting a channel region of the fin-type pattern F. Accordingly, semiconductor devices including such ghost fin-type patterns may have deteriorated reliability and operating characteristics.

Accordingly, semiconductor device according to some example embodiments can have enhanced reliability and operating characteristics by suppressing generation of the ghost fin-type pattern. Furthermore, the formation of the smooth pattern SP may provide the effect that leakage current of the fin-type pattern F is reduced.

Herein below, semiconductor devices according to some example embodiments will be described with reference to FIGS. 5 and 6. Meanwhile, elements or operations overlapping with those with reference to FIGS. 1 to 4 will be mentioned briefly or omitted for the sake of brevity.

Figure 5:
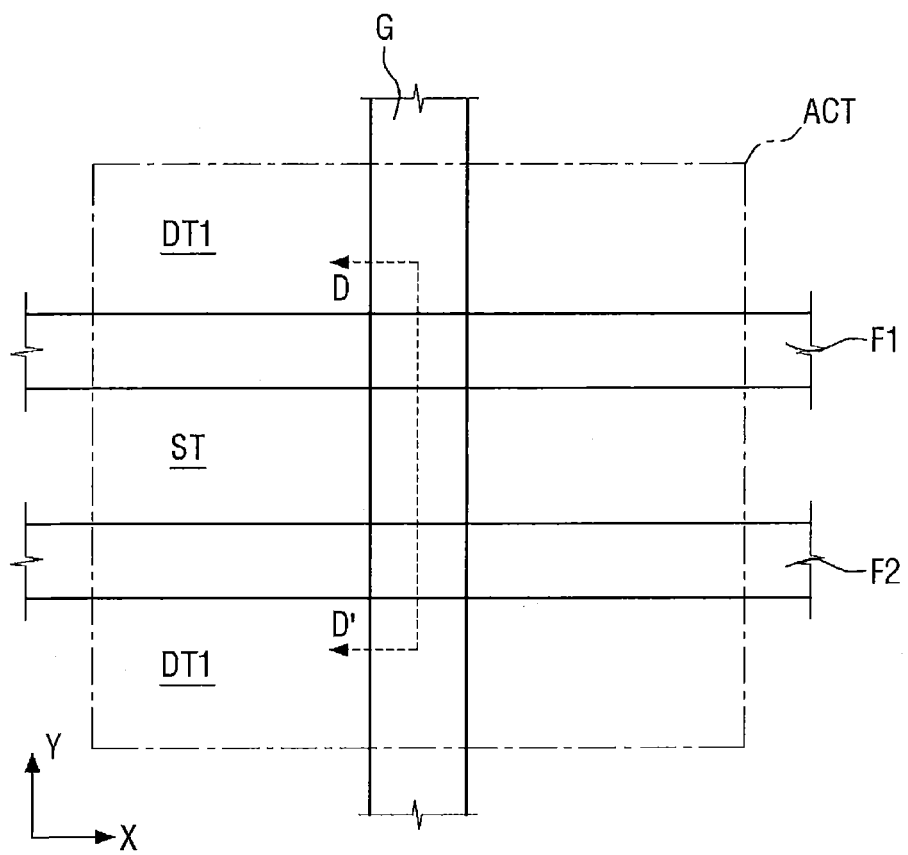
FIG. 5 is a layout diagram provided to explain semiconductor devices according to some example embodiments.
Figure 6:
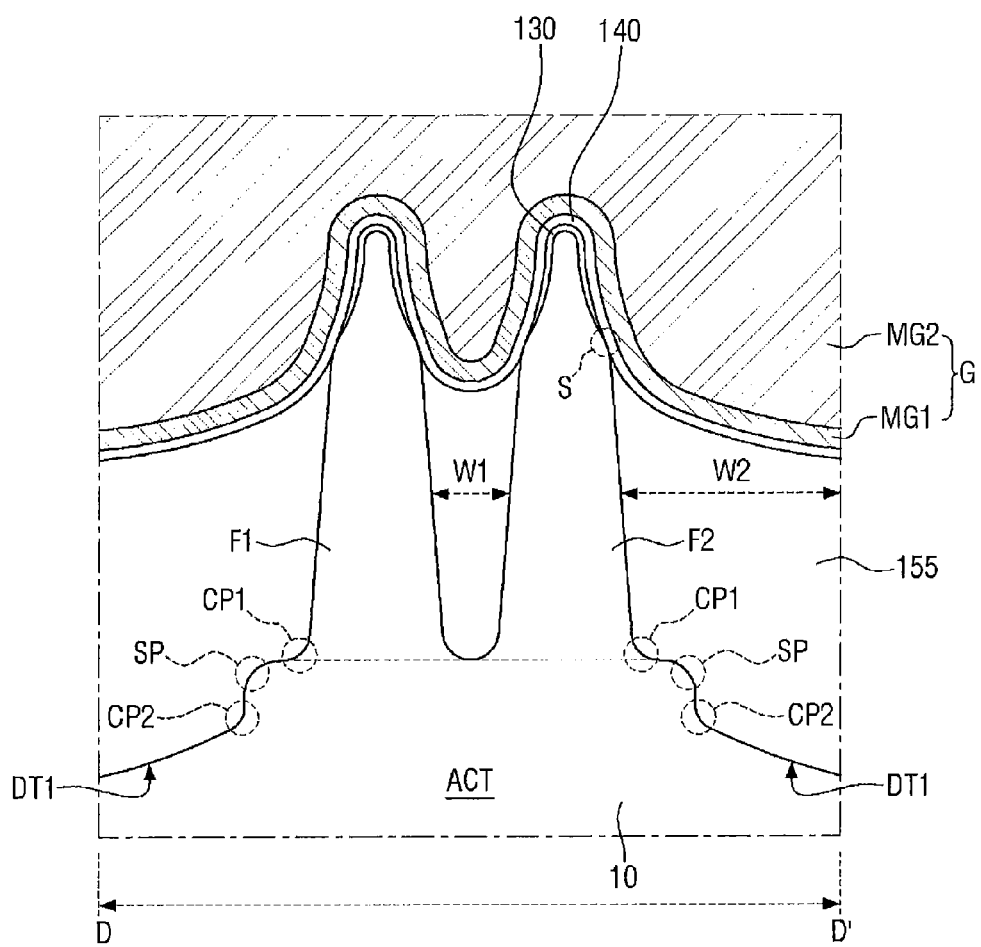
FIG. 6 is a cross sectional view taken on line D-D' of FIG. 5.

FIG. 5 is a layout diagram provided to explain semiconductor devices according to some example embodiments, and FIG. 6 is a cross sectional view taken on line D-D' of FIG. 5.

Referring to FIGS. 5 and 6, semiconductor devices according to some example embodiments may include first and second fin-type patterns F1, F2, a shallow trench ST, and a first deep trench DT1.

The first and second fin-type patterns F1, F2 may extend longitudinally in a first direction X1. The first and second fin-type patterns F1, F2 may be spaced apart from each other in the second direction Y1. The first and second fin-type patterns F1, F2 may be defined by the shallow trench ST and the first deep trench DT1. Specifically, the first fin-type pattern F1 and the second fin-type pattern F2 may be spaced apart from each other by the shallow trench ST. The shallow trench ST may be formed on a side surface of the first fin-type pattern F1, which is facing the second fin-type pattern F2. The first deep trench DT1 may be formed on a side surface which is not facing the shallow trench ST with reference to the first fin-type pattern F1. The first deep trench DT1 may be formed on a side surface which is not facing the shallow trench ST with reference to the second fin-type pattern F2.

The shallow trench ST may be formed between the first fin-type pattern F1 and the second fin-type pattern F2. A depth of the shallow trench ST may be less than a depth of the first deep trench DT. A width W1 of the shallow trench ST may be less than a width W2 of the first deep trench DT.

The smooth pattern SP may be formed on a portion where the fin-type pattern F is in contact with the first deep trench DT. The smooth pattern SP may not be formed on a portion where the fin-type pattern F is in contact with the shallow trench ST. The upper surface of the smooth pattern SP may be lower than a bottom surface of the shallow trench ST. However, example embodiments are not limited to the example given above. The upper surface of the smooth pattern SP may be higher than the bottom surface of the shallow trench ST.

The bottom surface of the first concave portion CP1 may be equal to or lower than the bottom surface of the shallow trench ST. The first concave portion CP1 may be a portion etched in the upper surface of the substrate 10 to a depth same as the shallow trench ST.

The bottom surface of the second concave portion CP2 may be lower than the bottom surface of the shallow trench ST. The second concave portion CP2 may be a portion already etched in the upper surface of the substrate 10 before the shallow trench ST is formed. Accordingly, the second concave portion CP2 may be formed deeper than the bottom surface of the shallow trench ST.

Herein below, semiconductor devices according to some example embodiments will be described with reference to FIGS. 5 and 7. Meanwhile, elements or operations overlapping with those with reference to FIGS. 1 to 6 will be mentioned briefly or omitted for the sake of brevity.

Figure 7:
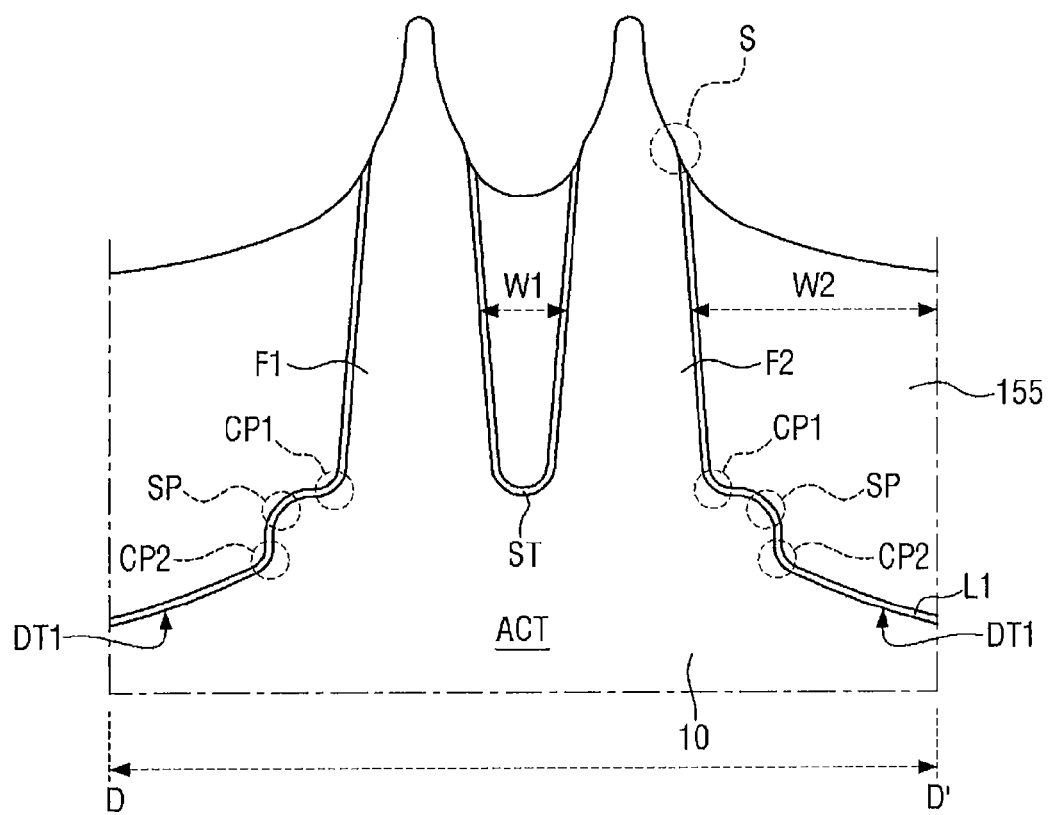
FIG. 7 is a cross sectional view provided to explain semiconductor devices according to some example embodiments.

FIG. 7 is a cross sectional view provided to explain semiconductor devices according to some example embodiments. FIG. 7 is a cross sectional view taken on line D-D' of FIG. 5. For convenience of explanation, FIG. 7 omits illustration of the gate insulating films 130, 140 and the gate electrode G of FIG. 6.

Referring to FIGS. 5 and 7, semiconductor devices according to some example embodiments may include a first liner L1.

The first liner L1 may be formed on side surfaces of the first and second fin-type patterns F1, F2. The first liner L1 may be formed conformally along the profile of the surface of the side surfaces of the first and second fin-type patterns F1, F2. Furthermore, the first liner L1 may be formed along the bottom surfaces of the shallow trench ST and the first deep trench DT. Further, the first liner L1 may be formed along portions of the sidewalls of the shallow trench ST and the first deep trench DT. The first liner L1 may be formed between the first and second fin-type patterns F1, F2 and the device isolating film 155. That is, the first liner L1 may be formed on surfaces of the lower portions of the first and second fin-type patterns F1, F2, and may not be formed on surfaces of the upper portions formed above with reference to the stepped portion S. However, example embodiments are not limited to any specific example only. Accordingly, the first liner L1 may also be formed on the surfaces of the upper portions depending on fabrication process. Likewise, depending on materials and fabrication process, the first liner L1 may be formed on not only the surfaces of the first and second fin-type patterns F1, F2, but also the upper surface of the substrate 10.

The first liner L1 may be formed of a material that applies a first stress to channel regions of the first and second fin-type patterns F1, F2. The first liner L1 may play a role of enhancing carrier mobility in the channel regions, by introducing the first stress to the channel regions of the first and second fin-type patterns F1, F2. In some example embodiments, when the channel regions are N-type channel regions, the first liner L1 may be formed of a material that applies a tensile stress to the channel regions. For example, the first liner L1 may be formed of silicon nitride (SiN), silicon oxynitride (SiON), silicon boronitride (SiBN), silicon carbide (SiC), SiC:H, SiCN, SiCN:H, SiOCN, SiOCN:

H, silicon oxycarbide (SiOC), silicon dioxide (SiO$_2$), polysilicon, or combinations thereof. In some example embodiments, the first liner L1 may have a thickness of approximately 10-100 Å.

Herein below, semiconductor devices according to some example embodiments will be described with reference to FIGS. 5 and 8. Meanwhile, elements or operations overlapping with those with reference to FIGS. 1 to 7 will be mentioned briefly or omitted for the sake of brevity.

Figure 8:
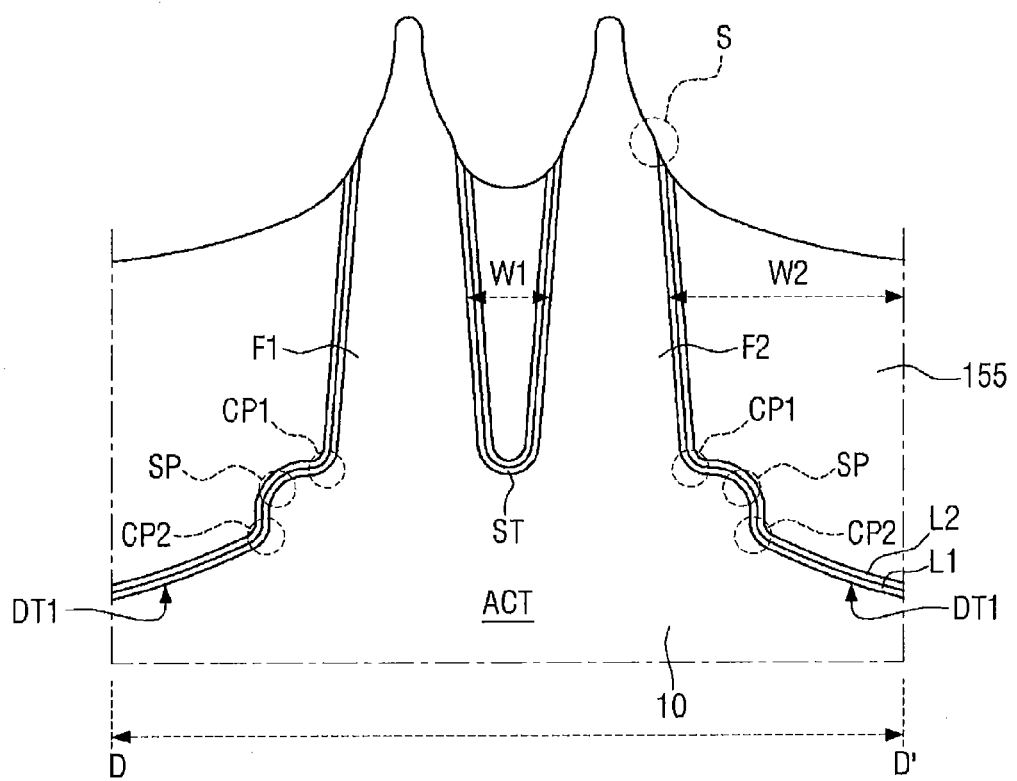
FIG. 8 is a cross sectional view provided to explain semiconductor devices according to some example embodiments.

FIG. 8 is a cross sectional view provided to explain semiconductor devices according to some example embodiments. FIG. 8 is a cross sectional view taken on line D-D' of FIG. 5. For convenience of explanation, FIG. 8 omits illustration of the gate insulating films 130, 140 and the gate electrode G of FIG. 6.

Referring to FIGS. 5 and 8, semiconductor devices according to some example embodiments may additionally include a second liner L2.

The second liner L2 may be formed between the first liner L1, and the first and second fin-type patterns F1, F2.

The second liner L2 may be formed of oxide film. For example, the second liner L2 may be formed of natural oxide film. In some example embodiments, the oxide film forming the second liner L2 may be obtained by performing a process of thermally oxidizing the surfaces of the first and second fin-type patterns F1, F2. In some example embodiments, the second liner L2 may have a thickness of approximately 10-100 Å.

Herein below, semiconductor devices according to some example embodiments will be described with reference to FIGS. 5 and 9. Meanwhile, elements or operations overlapping with those with reference to FIGS. 1 to 8 will be mentioned briefly or omitted for the sake of brevity.

Figure 9:
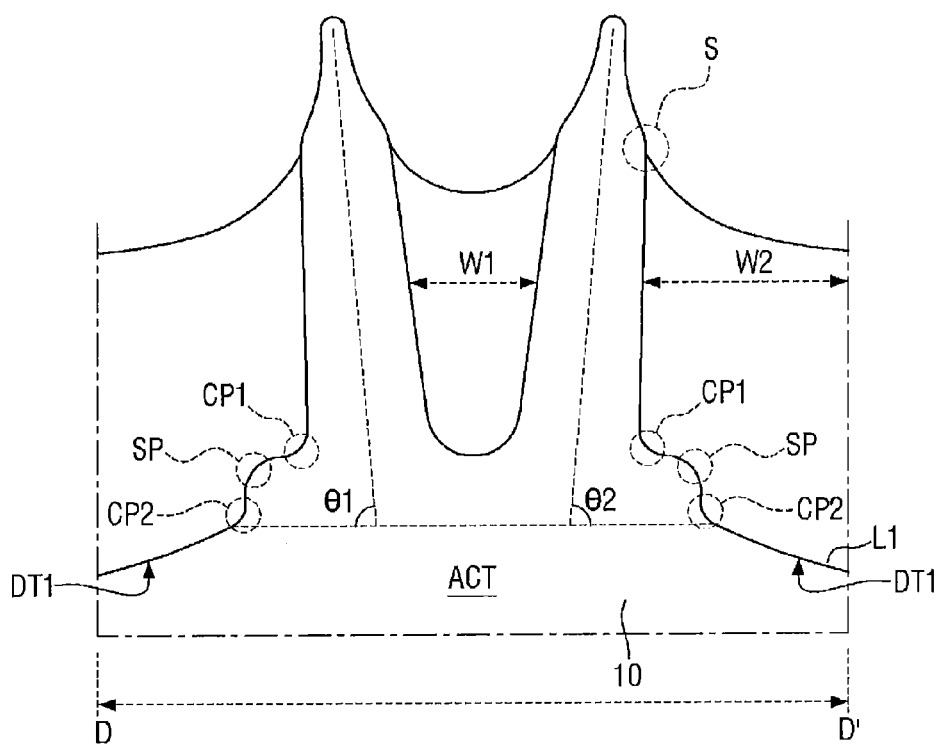
FIG. 9 is a cross sectional view provided to explain semiconductor devices according to some example embodiments.

FIG. 9 is a cross sectional view provided to explain semiconductor devices according to some example embodiments. FIG. 9 is a cross sectional view taken on line D-D' of FIG. 5. For convenience of explanation, FIG. 9 omits illustration of the gate insulating films 130, 140 and the gate electrode G of FIG. 6.

Referring to FIGS. 5 and 9, in semiconductor devices according to some example embodiments, the first and second fin-type patterns F1, F2 may be inclined.

The device isolating film 155 may have a specific stress characteristic. That is, the device isolating film 155 may have a tensile stress characteristic as its volume is shrunken by a heat process after deposition. A slope of the first and second fin-type patterns F1, F2 may be determined by the tensile stress characteristic of the device isolating film 155, depending on a volume of the device isolating film 155. That is, when the device isolating films 155 on opposite side surfaces have different volumes from each other, the slopes of the first and second fin-type patterns F1, F2 may increase as such difference in volume increases. This is because the shrink rate of the larger-volume device isolating film 155 is smaller than the shrink rate of the smaller-volume device isolating film 155.

Specifically, the first and second fin-type patterns F1, F2 may each be inclined in a direction of the first deep trench DT1 contacting the first and second fin-type patterns F1, F2, respectively. That is, a standing angle of the first fin-type pattern F1 to a direction of the first deep trench DT is a first angle θ1, and a standing angle of the second fin-type pattern F2 to a direction of the first deep trench DT is a second angle θ2. The first and second angles θ1, θ2 may be acute angles.

Herein below, semiconductor devices according to some example embodiments will be described with reference to FIGS. 10 and 11. Meanwhile, elements or operations overlapping with those with reference to FIGS. 1 to 8 will be mentioned briefly or omitted for the sake of brevity.

Figure 10:
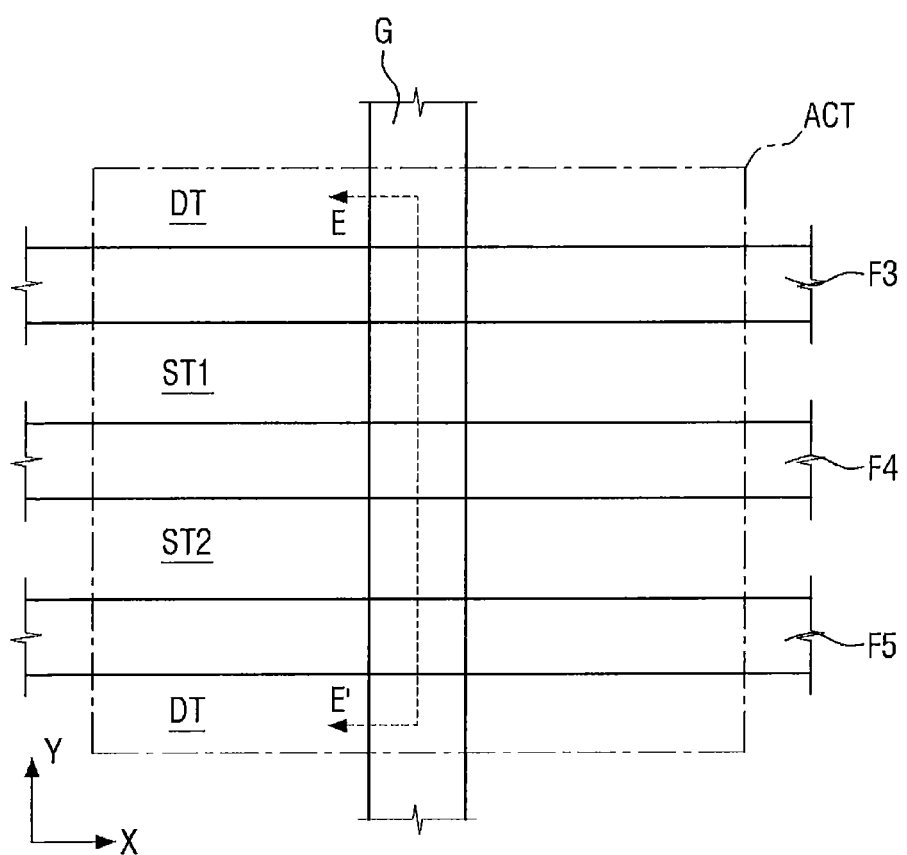
FIG. 10 is a layout diagram provided to explain semiconductor devices according to some example embodiments.
Figure 11:
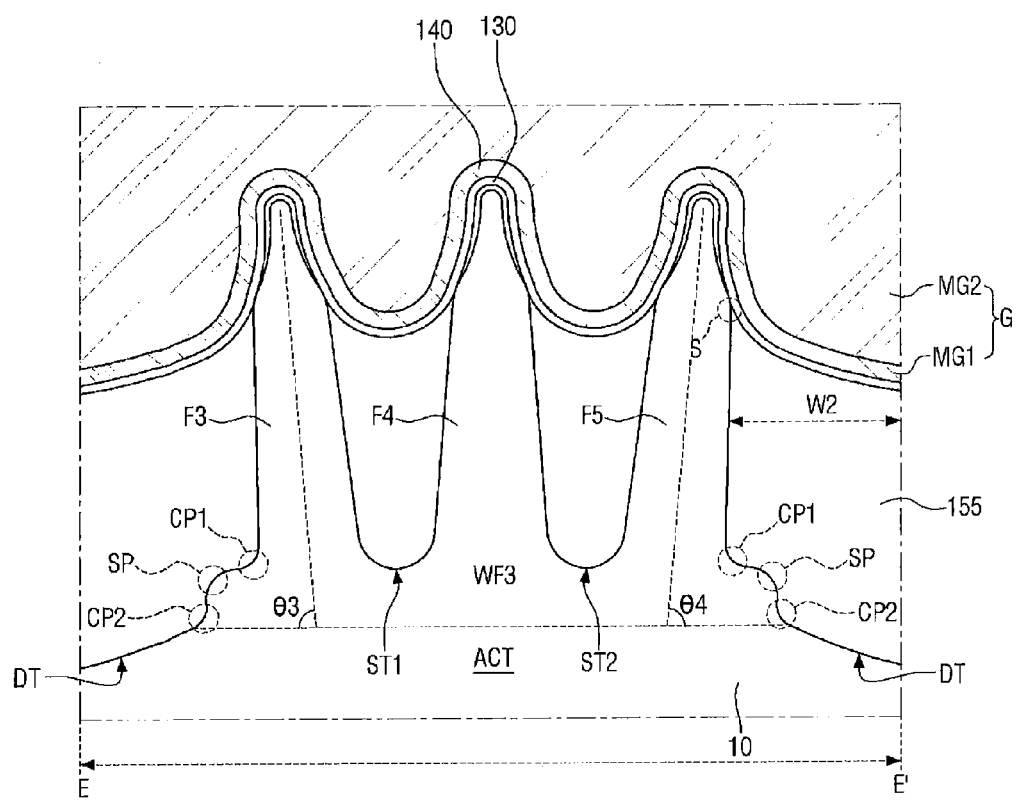
FIG. 11 is a cross sectional view taken on line E-E' of FIG. 10.

FIG. 10 is a layout diagram provided to explain semiconductor devices according to some example embodiments, and FIG. 11 is a cross sectional view taken on line E-E' of FIG. 10.

Referring to FIGS. 10 and 11, semiconductor devices according to some example embodiments may include third to fifth fin-type patterns F3-F5, first and second shallow trenches ST1, ST2, and a deep trench DT.

The third to fifth fin-type patterns F3-F5 may extend longitudinally in the first direction X1. The third to fifth fin-type patterns F3-F5 may be spaced apart from one another in the second direction Y1. The third to fifth fin-type patterns F3-F5 may be defined by the first and second shallow trenches ST1, ST2, and the deep trench DT.

Specifically, the third fin-type pattern F3 and the fourth fin-type pattern F4 may be spaced apart from each other by the first shallow trench ST1. The fourth fin-type pattern F4 and the fifth fin-type pattern F5 may be spaced apart from each other by the second shallow trench ST2. The first shallow trench ST1 may be formed on a side surface of the third fin-type pattern F3, which is facing the fourth fin-type pattern F4. The second shallow trench ST2 may be formed on a side surface of the fourth fin-type pattern F4, which is facing the fifth fin-type pattern F5. The deep trench DT may be formed on a side surface which is not facing the first shallow trench ST with reference to the third fin-type pattern F3. Another deep trench DT may be formed on a side surface which is not facing the second shallow trench ST with reference to the fifth fin-type pattern F5.

The first and second shallow trenches ST1, ST2 may be formed between the third to fifth fin-type patterns F3-F5. Specifically, the first shallow trench ST1 may be formed between the third fin-type pattern F3 and the fourth fin-type pattern F4. The second shallow trench ST2 may be formed between the fourth fin-type pattern F4 and the fifth fin-type pattern F5.

Depths of the first and second shallow trenches ST1, ST2 may be less than the depths of the deep trenches DT. Widths of the first and second shallow trenches ST1, ST2 may be less than widths of the deep trenches DT.

The smooth pattern SP may be formed on portions where the third fin-type pattern F3 and the fifth fin-type pattern are in contact with the deep trenches DT (i.e., at interfaces therebetween). The smooth pattern SP may not be formed on portions where the third to fifth fin-type patterns F3-F5 are in contact with the shallow trenches ST.

The upper surface of the smooth pattern SP may be lower than bottom surfaces of the first and second shallow trenches ST1, ST2. However, example embodiments are not limited to the example given above. The upper surface of the smooth pattern SP may be higher than the bottom surfaces of the first and second shallow trenches ST1, ST2.

The bottom surface of the first concave portion CP1 may be equal to or lower than the bottom surfaces of the first and second shallow trenches ST1, ST2. The first concave portion CP1 may be a portion etched in the upper surface of the substrate 10 to a depth same as the first and second shallow trenches ST1, ST2.

The bottom surface of the second concave portion CP2 may be lower than the bottom surfaces of the first and second shallow trenches ST1, ST2. The second concave portion CP2 may be a portion already etched in the upper surface of the substrate 10 before the first and second shallow trenches ST1, ST2 are formed. Accordingly, the second concave portion CP2 may be formed deeper than the bottom surfaces of the first and second shallow trenches ST1, ST2.

Specifically, the third fin-type pattern F3 and fifth fin-type pattern F5 may be inclined in a direction of the deep trench DT contacting third and fifth fin-type patterns F3, F5, respectively. That is, a standing angle of the third fin-type pattern F3 to a direction of the deep trench DT is a first angle θ3, and a standing angle of the fifth fin-type pattern F5 to a direction of the deep trench DT is a second angle θ4. The first and second angles θ3, θ4 may be acute angles. However, embodiments are not limited to any of the examples given above. The first and second angles θ3, θ4 may be right angles or obtuse angles.

Herein below, semiconductor devices according to some example embodiments will be described with reference to FIG. 12. Meanwhile, elements or operations overlapping with those with reference to FIGS. 1 to 11 will be mentioned briefly or omitted for the sake of brevity.

Figure 12:
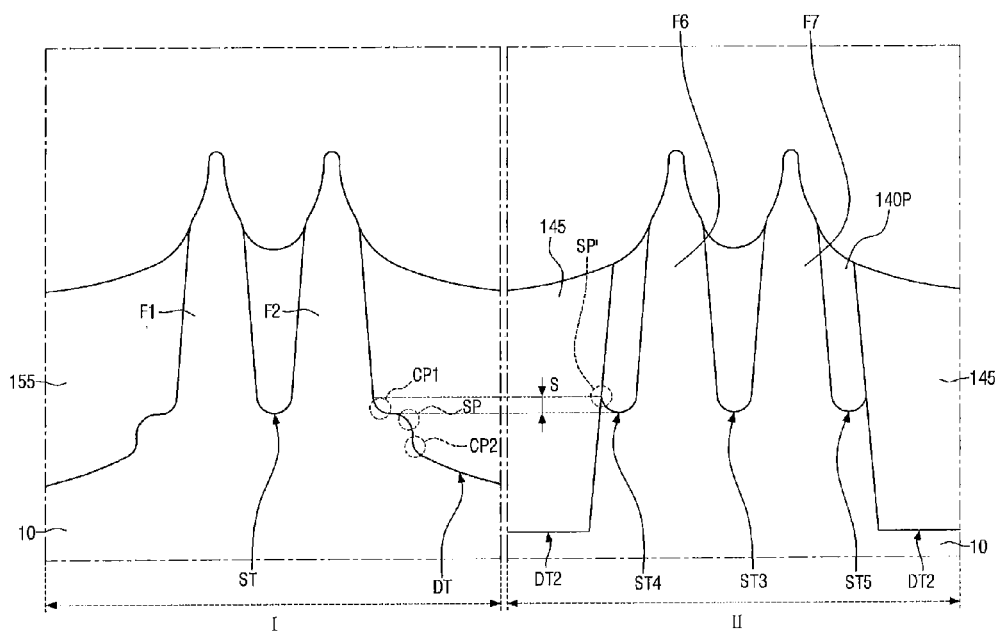
FIG. 12 is a cross sectional view provided to explain semiconductor devices according to some example embodiments.

FIG. 12 is a cross sectional view provided to explain semiconductor devices according to some example embodiments. For convenience of explanation, FIG. 12 omits illustration of the gate insulating films 130, 140 and the gate electrode G.

Referring to FIG. 12, in semiconductor devices according to some example embodiments, a substrate 10 includes a first region I and a second region II. The first region I and the second region II may be regions adjacent to each other, or spaced apart from each other in the same semiconductor device.

Like the semiconductor device of FIG. 6, the semiconductor device may include, in the first region I, a first fin-type pattern F1, a second fin-type pattern F2, a shallow trench ST, a first deep trench DT, a device isolating film 155, a smooth pattern SP, a first concave portion CP1, a second concave portion CP2, etc.

Semiconductor devices may include, in the second region II, a seventh fin-type pattern F7, an eighth fin-type pattern F8, a third shallow trench ST3, a fourth shallow trench ST4, a fifth shallow trench ST5, a second deep trench DT2, and a sharp pattern SP'.

Like the first fin-type pattern F1 and the second fin-type pattern F2, the seventh fin-type pattern F7 and the eighth fin-type pattern F8 may extend longitudinally in a first direction X1. However, example embodiments are not limited to the example given above. The directions of extension of the fin-type patterns in the first region I and the second region II may be different from each other. It assumed herein that the fin-type pattern in the first region I and the fin-type pattern in the second region II extend in a same direction.

The seventh and eighth fin-type patterns F7, F8 may be spaced apart from each other in the second direction Y1. The seventh and eighth fin-type patterns F7, F8 may be defined by the third to fifth shallow trenches ST3-ST5 and the second deep trench DT2. Specifically, the seventh fin-type pattern F7 and the eighth fin-type pattern F8 may be spaced apart from each other by the third shallow trench ST3. The third shallow trench ST3 may be formed on a side surface of the seventh fin-type pattern F7, which is facing the eighth fin-type pattern F8. The fourth shallow trench ST4 may be formed on a side surface which is not facing the third shallow trench ST3 with reference to the seventh fin-type pattern F7. The fifth shallow trench ST5 may be formed on a side surface which is not facing the third shallow trench ST3 with reference to the eighth fin-type pattern F8.

The second deep trench DT2 may be in contact with the fourth shallow trench ST4. That is, the fourth shallow trench ST4 may be formed between the second deep trench DT2 and the seventh fin-type pattern F7. In this case, the fourth shallow trench ST4 may be removed of one sidewall by a fin cut process. That is, the fourth shallow trench ST4 may have the sidewall of the seventh fin-type pattern F7 as one side, and be in contact with the second deep trench DT2 on the other side.

Another second deep trench DT2 may be in contact with the fifth shallow trench ST5. That is, the fifth shallow trench ST5 may be formed between the second deep trench DT2 and the eighth fin-type pattern F8. In this case the fifth shallow trench ST5 may be removed of one sidewall by a fin cut process. That is, the fifth shallow trench ST5 may have the sidewall of the eighth fin-type pattern F8 as one side, and be in contact with the second deep trench DT2 on the other side.

The second deep trench DT2 in the second region II may be formed deeper than the first deep trench DT in the first region I. The shallow trench ST in the first region I may have a same depth as the third and fourth shallow trenches ST3, ST4 in the second region II. The term "same" depth as used herein may refer to a depth formed by an etch process performed at different time points from each other, but in the same manner as each other, and may include a fine stepped portion of a depth according to same process.

The device isolating film 140P may fill the third to fifth shallow trenches ST3-ST5 in the second region II. The device isolating film 140P may fill a portion of the third to fifth shallow trenches ST3-ST5 in the second region II. That is, the device isolating film 140P may expose the upper surfaces of the seventh and eighth fin-type patterns F7 to F8.

The second device isolating film 145 may fill the second deep trench DT2 in the second region II. The second device isolating film 145 may be in contact with the first device isolating film 140P. Specifically, the second device isolating film 145 may be in contact with the first device isolating film 140P formed in the fourth shallow trench ST4. Further, the second device isolating film 145 may be in contact with the first device isolating film 140P formed in the fifth shallow trench ST5.

The second device isolating film 145 may include a material same as the first device isolating film 140P. However, example embodiments are not limited to any of the examples given above. The second device isolating film 145 and the first device isolating film 140P may include different materials from each other. For example, a material included in the first device isolating film 140P may have better gap filling capability than a material included in the second device isolating film 145.

The first device isolating film 140P and the second device isolating film 145 may include a material same as the device isolating film 155. However, example embodiments are not limited to the example given above. For example, the first device isolating film 140P and the second device isolating film 145 may include at least one of silicon oxide, silicon nitride, silicon oxynitride, or a low-k dielectric material with a smaller dielectric constant than silicon oxide. For example, the low-k dielectric material may include flowable oxide (FOX), Tonen silazen (TOSZ), undoped silica glass (USG), borosilicate glass (BSG), phosphosilicate glass (PSG), borophosphosilicate glass (BPSG), plasma enhanced tetraethyl orthosilicate (PETEOS), fluoride silicate glass (FSG), carbon doped silicon oxide (CDO), xerogel, aerogel, amorphous fluorinated carbon, organo silicate glass (OSG), parylene, bis-benzocyclobutenes (BCB), SiLK, polyimide, porous polymeric material, or combinations thereof, but not limited thereto.

The sharp pattern SP' may be formed in the second region II. The sharp pattern SP' may be formed between the second deep trench DT2 and the fourth shallow trench ST4. Additionally or alternatively, the sharp pattern SP' may be formed between the second deep trench DT2 and the fifth shallow trench ST5.

An upper surface of the sharp pattern SP' may include a point at which a slope of the upper surface is discontinuous. That is, the sharp pattern SP' may include a sharp and raised portion. The upper surface of the sharp pattern SP' may be higher than an upper surface of the smooth pattern SP in the first region I. A height of an uppermost portion of the sharp pattern SP' may be formed to be a predetermined height S higher than an uppermost portion of the smooth pattern SP.

Herein below, semiconductor devices according to some example embodiments will be described with reference to FIG. 13. Meanwhile, elements or operations overlapping with those with reference to FIGS. 1 to 12 will be mentioned briefly or omitted for the sake of brevity.

Figure 13:
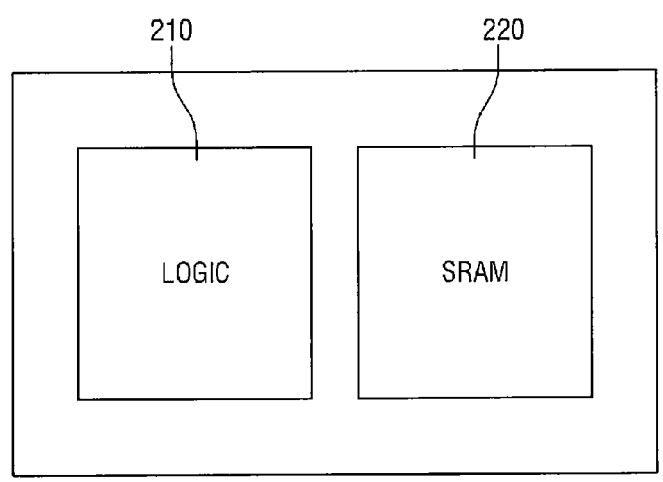
FIG. 13 is a conceptual view provided to explain semiconductor devices according to some example embodiments.

FIG. 13 is a conceptual view provided to explain semiconductor devices according to some example embodiments;

Referring to FIG. 13, semiconductor devices according to an example embodiment may include a logic region 210 and SRAM forming region 220. Logic devices for operation of semiconductor devices may be formed in the logic region 210, and SRAM may be formed in the SRAM forming region 220.

In some example embodiments, any of the semiconductor devices according to example embodiments described above may be disposed in the SRAM forming region 220. Further, in other example embodiments, any of the semiconductor devices according to example embodiments described above may be disposed in combination with another in the SRAM forming region 220.

In some example embodiments, the first region I of FIG. 12 may be formed in the logic region 210, and the second region II of FIG. 12 may be formed in the SRAM forming region 220.

While FIG. 13 exemplifies the logic region 210 and the SRAM forming region 220, example embodiments are not limited thereto. For example, the present disclosure may also apply to the logic region 210, and a region formed with other memories (for example, DRAM, MRAM, RRAM, PRAM, etc.).

Figure 14:
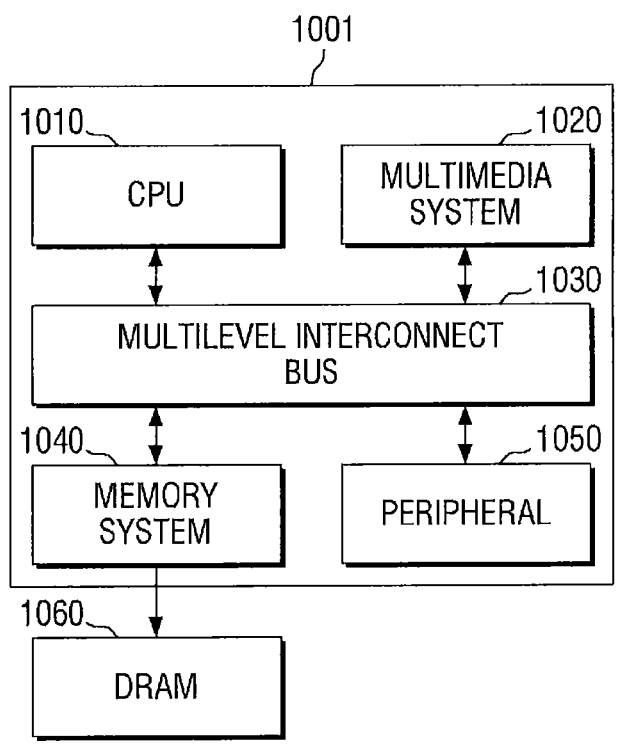
FIG. 14 is a block diagram of a system-on-chip (SoC) system including semiconductor devices according to example embodiments.

FIG. 14 is a block diagram of a SoC system including semiconductor devices according to example embodiments.

Referring to FIG. 14, the SoC system 1000 includes an application processor 1001 and a DRAM 1060.

The application processor 1001 may include a central processing unit (CPU) 1010, a multi-media system 1020, a multilevel interconnect bus 1030, a memory system 1040, and a peripheral circuit 1050.

The CPU 1010 may perform arithmetic operation for driving of the SoC system 1000. In some example embodiments, the CPU 1010 may be configured on a multi-core environment which includes a plurality of cores.

In an example embodiment, the CPU 1010 may include a cache memory including for example, SRAM. The cache memory may include L1 cache memory, L2 cache memory, etc. According to some example embodiments described above, semiconductor devices may be employed as a component of such cache memory, for example.

The multimedia system 1020 may be used for performing a variety of multimedia functions on the SoC system 1000. The multimedia system 1020 may include, for example, a 3D engine module, a video codec, a display system, a camera system, a post-processor, or the like.

The multilevel interconnect bus 1030 may be used for exchanging data communication among the CPU 1010, the multimedia system 1020, the memory system 1040 and the peripheral circuit 1050. In some example embodiments of the present disclosure, the multilevel interconnect bus 1030 may have a multi-layer structure. Specifically, an example of the multilevel interconnect bus 1030 may be a multi-layer advanced high-performance bus (AHB), or a multi-layer advanced eXtensible interface (AXI), although example embodiments are not limited herein.

The memory system 1040 may provide environments for the application processor 1001 to connect to an external memory (e.g., DRAM 1060) and perform high-speed operation. In some example embodiments of the present disclosure, the memory system 1040 may include a separate controller (e.g., DRAM controller) to control an external memory (e.g., DRAM 1060).

The peripheral circuit 1050 may provide environments for the SoC system 1000 to have a seamless connection to an external device (e.g., main board). Accordingly, the peripheral circuit 1050 may include a variety of interfaces to allow compatible operation with the external device connected to the SoC system 1000.

The DRAM 1060 may function as an operation memory for the operation of the application processor 1001. In some example embodiments, the DRAM 1060 may be disposed externally to the application processor 1001, as illustrated. Specifically, the DRAM 1060 may be packaged into a package on package (PoP) type with the application processor 1001.

At least one of the above-mentioned components of the SoC system 1000 may include at least one of the semiconductor devices according to the example embodiments explained above.

Figure 15:
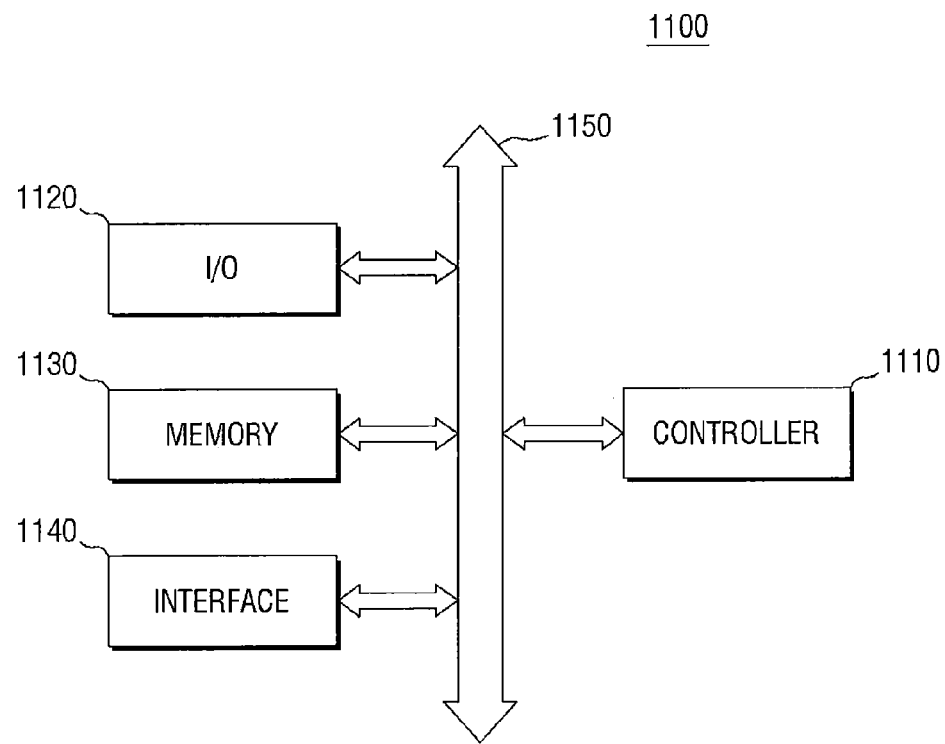
FIG. 15 is a block diagram of an electronic system including semiconductor devices according to example embodiments.

FIG. 15 is a block diagram of an electronic system including semiconductor devices according to example embodiments.

Referring to FIG. 15, the electronic system 1100 according to an example embodiment may include a controller 1110, an input/output (I/O) device 1120, a memory device 1130, an interface 1140 and a bus 1150. The controller 1110, the I/O device 1120, the memory device 1130 and/or the interface 1140 may be coupled with one another via the bus 1150. The bus 1150 corresponds to a path through which data travels.

The controller 1110 may include at least one of microprocessor, digital signal process, microcontroller, or logic devices capable of performing functions similar to the functions of those mentioned above. The I/O device 1120 may include a keypad, a keyboard or a display device. The memory device 1130 may store data and/or commands. The interface 1140 may perform a function of transmitting or receiving data to or from communication networks. The interface 1140 may be in a wired or wireless form. For example, the interface 1140 may include an antenna or a wired/wireless transceiver.

Although not illustrated, the electronic system 1100 may additionally include an operation memory configured to enhance operation of the controller 1110, such as a high-speed dynamic random-access memory (DRAM) and/or a static random access memory (SRAM). For example, when the electronic system 1100 includes a high-speed SRAM, semiconductor devices according to example embodiments described above may be employed in such a high-speed SRAM.

Further, semiconductor devices according to the example embodiments may be provided within the memory device 1130, or provided as a part of the controller 1110, the I/O device 1120, etc.

The electronic system 1100 may be applicable to or used in a personal digital assistant (PDA) portable computer, a web tablet, a wireless phone, a mobile phone, a digital music player, a memory card, or any electronic products capable of transmitting and/or receiving data in wireless environments.

Herein below, methods for fabricating semiconductor devices according to some example embodiments will be described with reference to FIGS. 5, 6 and 16 to 26. In the following description, example embodiments of semiconductor devices already described above will not be described or described briefly for the sake of brevity.

FIGS. 16 to 26 are views illustrating intermediate stages of fabrication, provided to explain methods for fabricating semiconductor devices according to some example embodiments.

Figure 16:
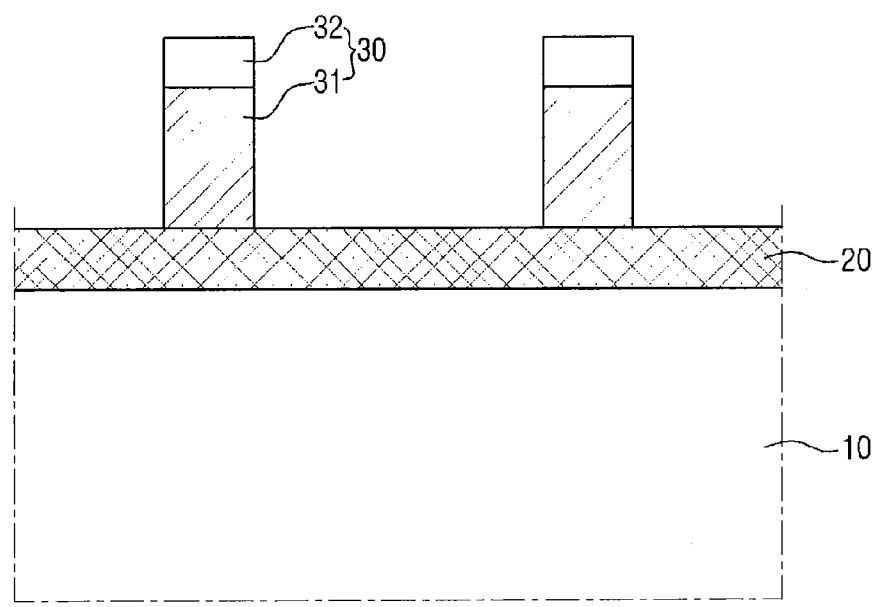
FIGS. 16 to 26 are views illustrating intermediate stages of fabrication, provided to explain methods of fabricating semiconductor devices according to some example embodiments.

Referring to FIG. 16, a hard mask layer 20 is formed on the substrate 10, and a sacrificial pattern 30 is formed on the hard mask layer 20.

The substrate 10 may for example be bulk silicon or silicon-on-insulator (SOD. The substrate 10 may be a silicon substrate, or may include other material such as silicon germanium, indium antimonide, lead telluride compound, indium arsenide, indium phosphide, gallium arsenide, or gallium antimonide. The substrate 10 may be a base substrate having an epitaxial layer formed thereon.

The hard mask layer 20 may be configured as a plurality of layers. One or more of the layers may be formed of at least one of silicon-containing material such as silicon oxide (SiOx), silicon oxynitride (SiON), silicon nitride (SixNy), tetra ethyl ortho silicate (TEOS), or polycrystalline silicon, etc, carbon-containing material such as amorphous carbon layer (ACL) or Spin-On Hardmask (SOH), or metal. A lower layer of the plurality of layers may be formed of silicon nitride, for example, and the lower layer may additionally include a thin silicon oxide under the silicon nitride. A middle layer may be formed of silicon oxide. An upper layer may be formed of polycrystalline silicon. However, example embodiments are not limited to the example given above.

Figure 17:
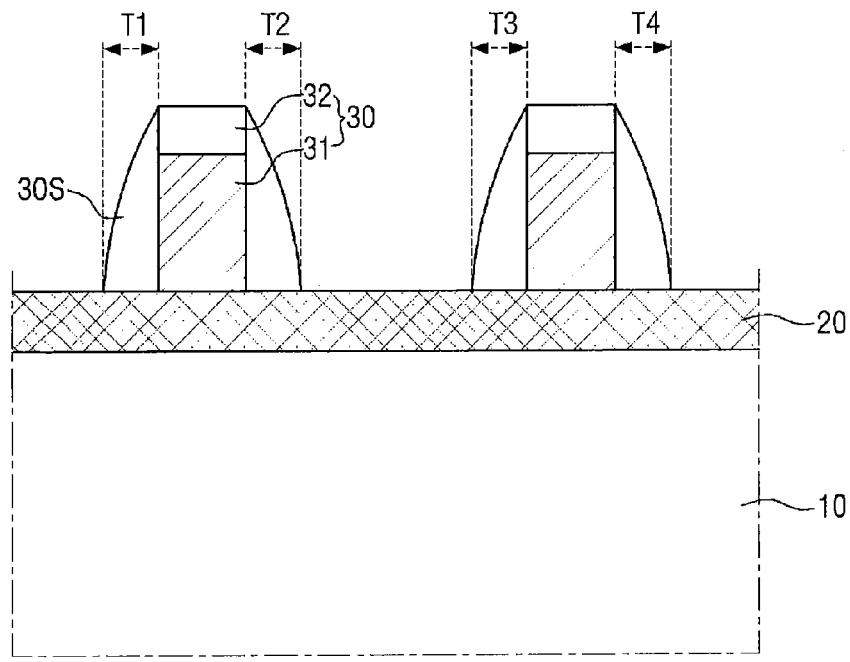

The sacrificial pattern 30 is for forming a spacer pattern 30S in the subsequent process (see FIG. 17). The sacrificial pattern 30 may include a sacrificial film 31 and an anti-reflection film 32.

The sacrificial film 31 may be patterned and formed on the hard mask layer 20. The sacrificial film 31 may include any of polycrystalline silicon, ACL, or SOH.

The anti-reflection film 32 may be formed on the sacrificial film 31. The anti-reflection film 32 may include layers to reduce or prevent light from reflecting against an underlying layer during photolithography process. The anti-reflection film 32 may be formed of an oxynitride film (SiON).

The hard mask layer 20, the sacrificial film 31, and the anti-reflection film 32 may be formed by the process such as, for example, atomic layer deposition (ALD), chemical vapor deposition (CVD), spin coating, etc., and depending on materials used, baking or curing process may be added.

Referring to FIG. 17, the spacer pattern 30S may be formed on a sidewall of the sacrificial pattern 30.

Specifically, a spacer material layer conformally overlaying the sacrificial pattern 30 may be formed, and then an etchback process may be performed, thus forming the spacer pattern 30S on the sidewall of the sacrificial pattern 30. A width of the spacer pattern 30S may be determined by considering a pitch between the fin-type patterns to be finally formed. The pitch between the fin-type patterns to be finally formed may be narrower than resolution limit of commercialized photography devices. The pitch between adjacent ones of the spacer patterns 30S may be substantially uniform in some embodiments.

A material of the spacer pattern 30S may be formed of a material having etch selectivity to the sacrificial pattern 30. For example, when the sacrificial pattern is formed of polycrystalline silicon, amorphous carbon layer (ACL), or Spin-On Hardmask (SOH), the spacer material layer may be formed of silicon oxide or silicon nitride. The spacer material layer may be formed by atomic layer deposition (ALD). In this case, depths or widths T1-T4 of the spacer pattern 30S may be uniform. That is, by equalizing the depths or widths T1-T4 of the spacer pattern 30S with atomic layer deposition, it is possible to form the fin-type pattern of a same width in the subsequent process.

The process of forming the spacer pattern 30S described above may be a part of the process of double patterning technology (DPT) or quadruple patterning technology (QPT). Accordingly, pitch between respective spacer patterns 30S may be constant or uniform. However, example embodiments are not limited to the example given above.

Figure 18:
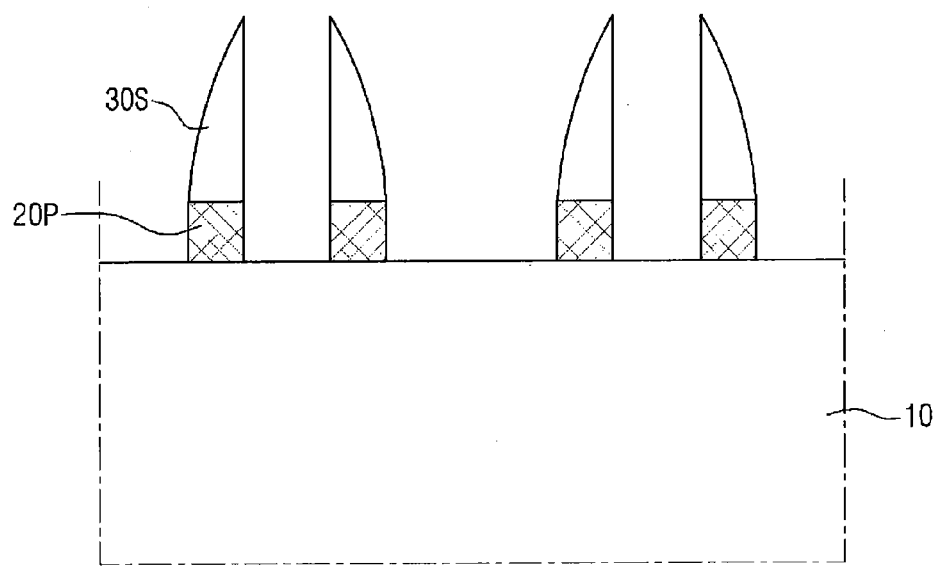

Referring to FIG. 18, the sacrificial pattern 30 is removed and the hard mask layer 20 is etched using the spacer pattern 30S as a mask to form a mask pattern 20P.

Since the spacer pattern 30S has etch selectivity to the sacrificial pattern in specific etch conditions, the sacrificial pattern may be selectively removed. By removing the sacrificial pattern 30, a spacer pattern 30S remaining in a line shape may be formed.

The mask pattern 20P may be formed on the substrate by anisotropic etching the hard mask layer 20 using the spacer pattern 30S as a mask.

Figure 19:
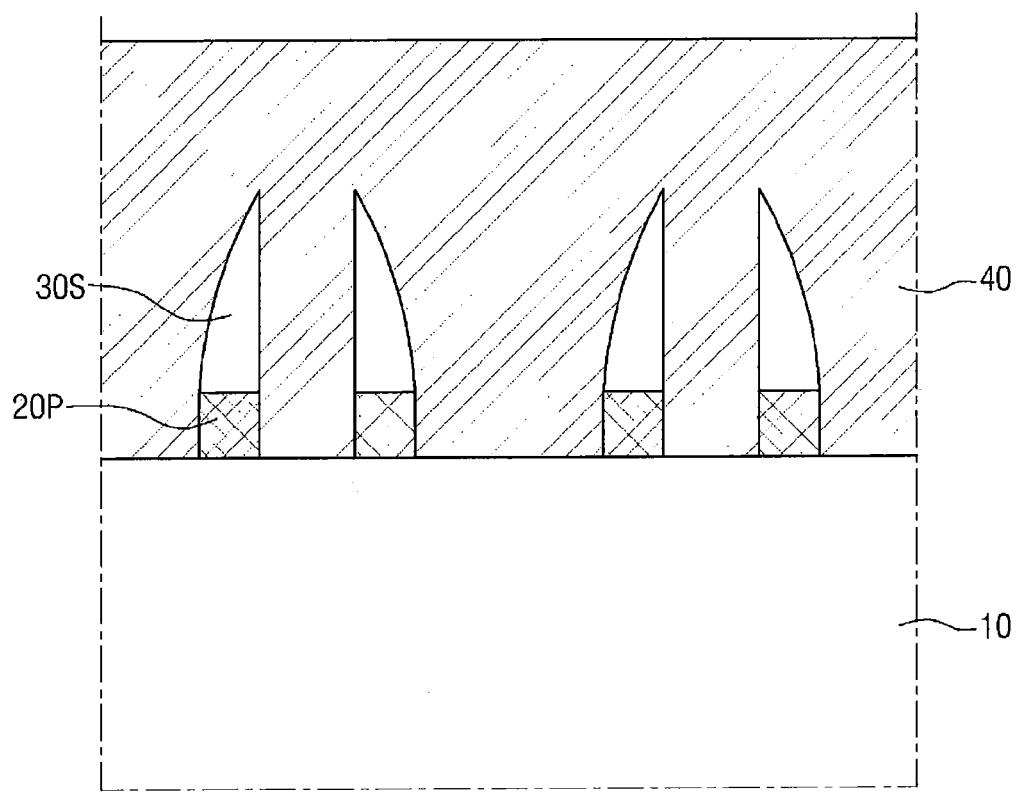

Referring to FIG. 19, a blocking film 40 overlaying a mask pattern 20P and the spacer pattern 30S may be formed on the substrate 10.

The blocking film 40 may overlay an upper surface of the substrate 10, a side surface of the mask pattern 20P, and an upper surface and a side surface of the spacer pattern 30S entirely.

Figure 20:
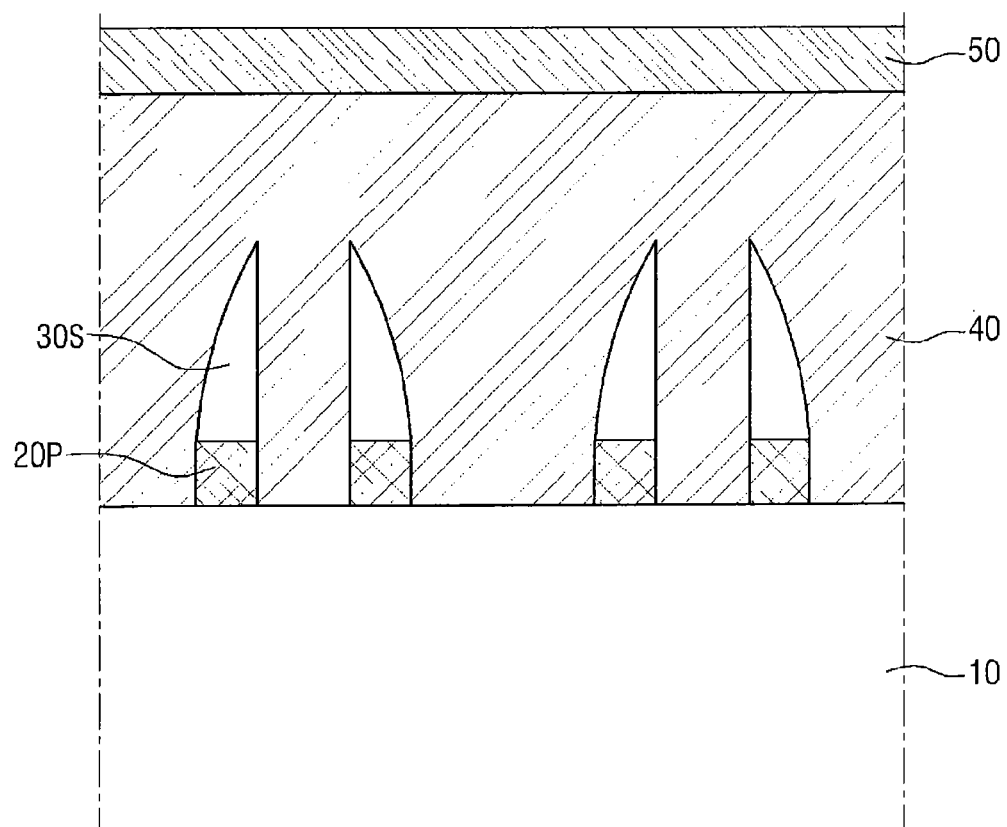

Referring to FIG. 20, a photosensitive film 50 may be formed on the blocking film 50.

The photosensitive film 50 may include photoresist (PR). The photosensitive film 50 may be formed for photolithography process.

Figure 21:
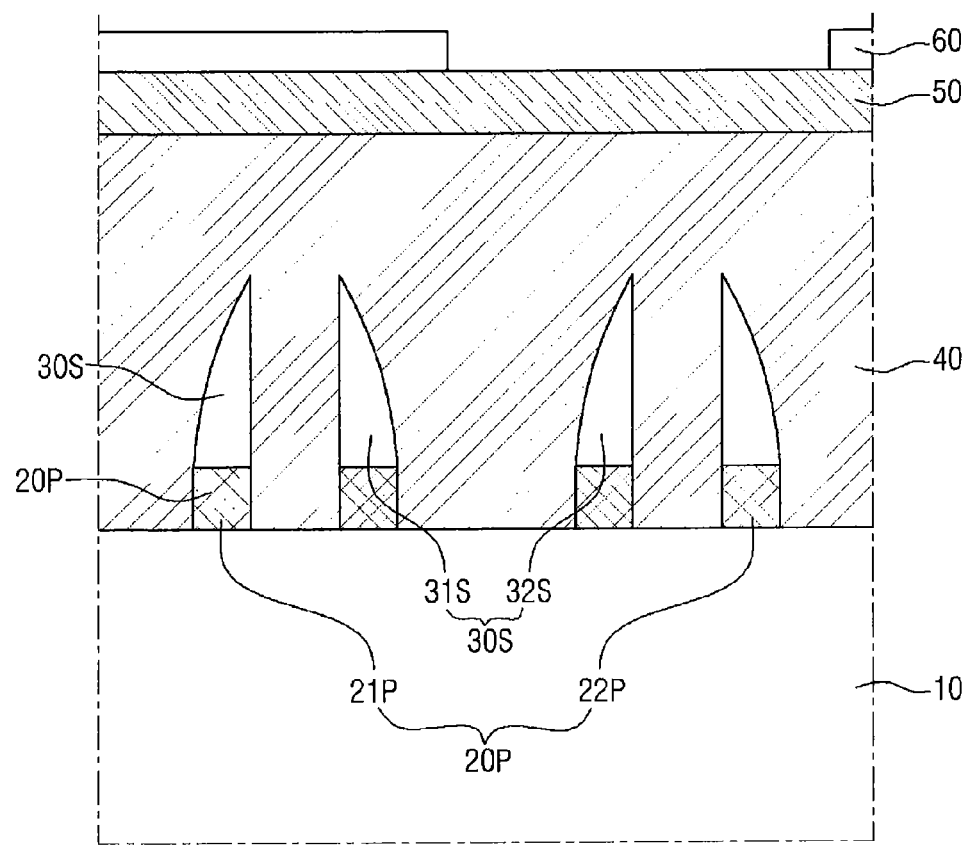

Referring to FIG. 21, a pattern film 60 may be formed to expose a portion of the photosensitive film 50, and the photolithography process may be performed.

The pattern film 60 may be a film though which light is not able to pass during the photolithography process. The exposed portion of the photosensitive film 50 by the pattern film 60 may be softened by photolithography. Accordingly, the exposed portion of photosensitive film 50 may be removed depending on the shape of the pattern film 60 at a later stage. However, it is also possible that the exposed portion may be cured depending on the types of the photosensitive film 50. In this case, a portion to be removed may be overlaid by the pattern film 60.

At this time, the spacer patterns 30S may be divided into real spacer patterns 31S and dummy spacer patterns 32S. That is, of the spacer patterns 30S, the spacer patterns 30S overlapping with the pattern film 60 may be classified as real spacer patterns 31S. In contrast, of the spacer patterns 30S, the spacer patterns 30S not overlapping with the pattern films 60 may be classified as dummy spacer patterns 32S.

Further, the mask patterns 20P may be classified into real mask patterns 21P and dummy mask patterns 22P. That is, of the mask patterns 20P, the mask patterns 20P overlapping with the pattern film 60 may be classified as real mask patterns 21P. In contrast, of the mask patterns 20P, the mask patterns 20P not overlapping with the pattern film 60 may be classified as dummy mask patterns 22P.

Figure 22:
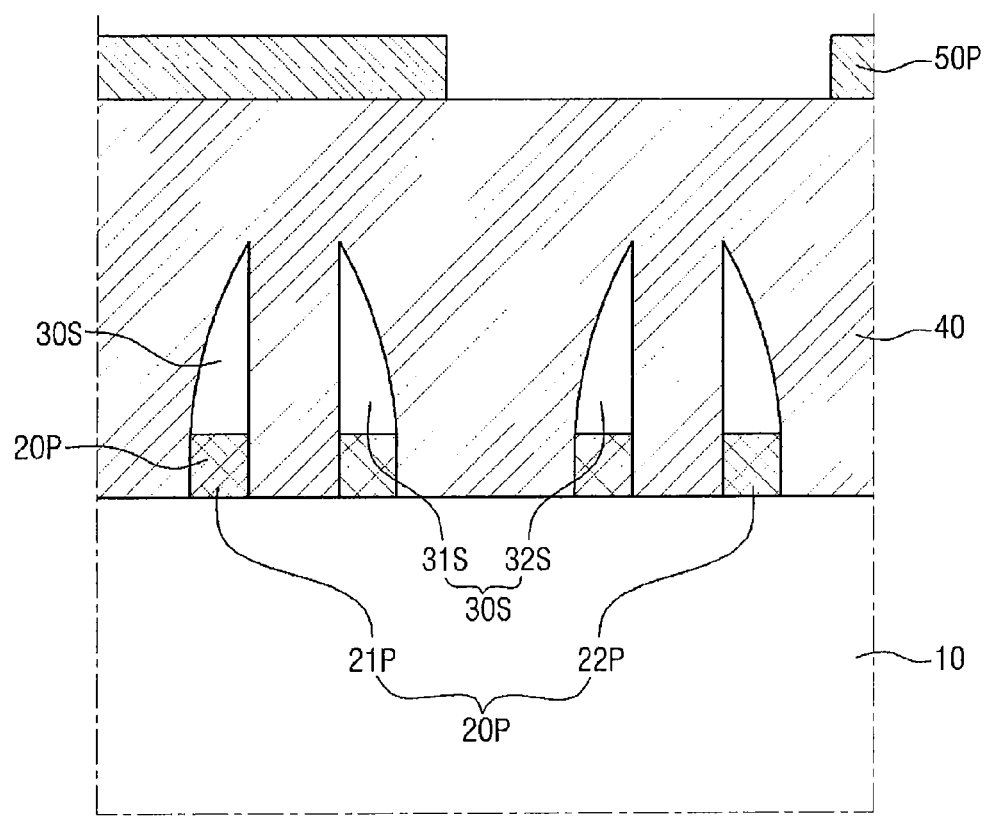

Referring to FIG. 22, a portion of photosensitive film 50 may be removed to form a photosensitive film pattern 50P.

The photosensitive film pattern 50P may be transferred into the same shape as the pattern film 60, or may be transferred into a reverse shape of the pattern film 60. Accordingly, as illustrated, a portion of the blocking film 40 may be exposed.

Figure 23:
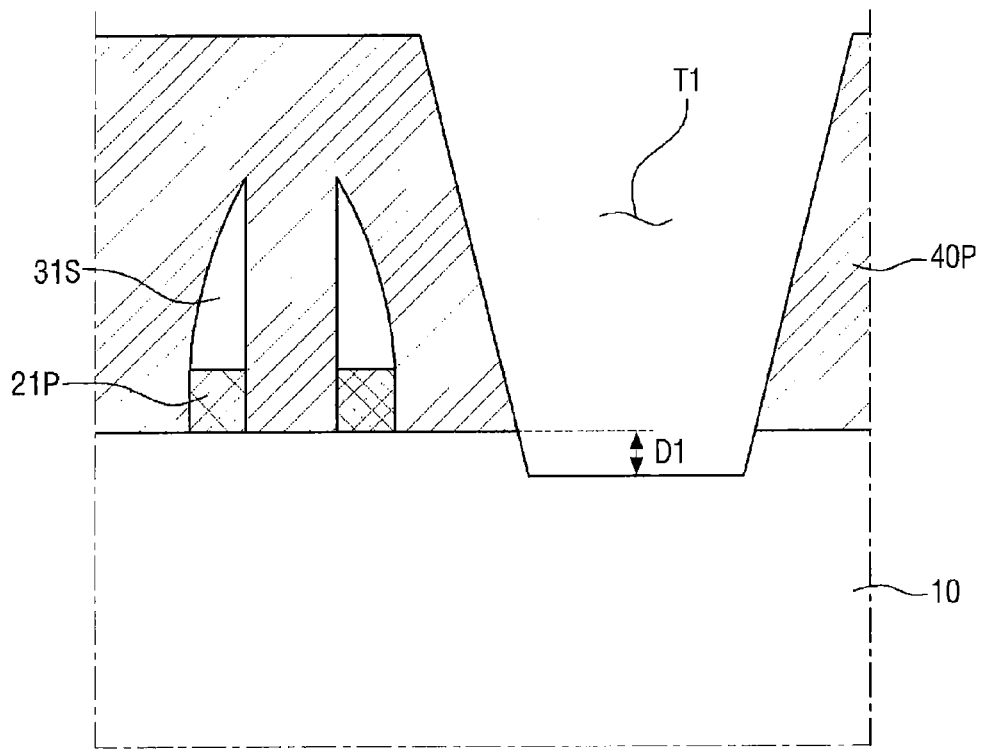

Referring to FIG. 23, a portion of the blocking film 40 (exposed by the photosensitive film pattern 50P), the dummy spacer pattern 32S, and the dummy mask pattern 22P may be removed.

According to removal of the portion of the blocking film 40 exposed by the photosensitive film pattern 50P, the dummy spacer pattern 32S, and the dummy mask pattern, a first trench T1 may be formed. According to removal of the exposed portion of the blocking film 40, the dummy spacer pattern 32S, and the dummy mask pattern, a portion of the substrate 10 may be etched. As a result, the upper surfaces of the substrate 10 may be lowered slightly. Accordingly, a bottom surface of the first trench T1 may be lowered by a first depth D1, compared to a portion where the blocking film 40 is not removed.

At this time, the blocking film 40, the dummy spacer pattern 32S, and the dummy mask pattern 22P may be removed in a sequential order, or at once. That is, the manners in which the blocking film 40, the dummy spacer pattern 32S, and the dummy mask pattern 22P are removed are not limited to any specific example.

Figure 24:
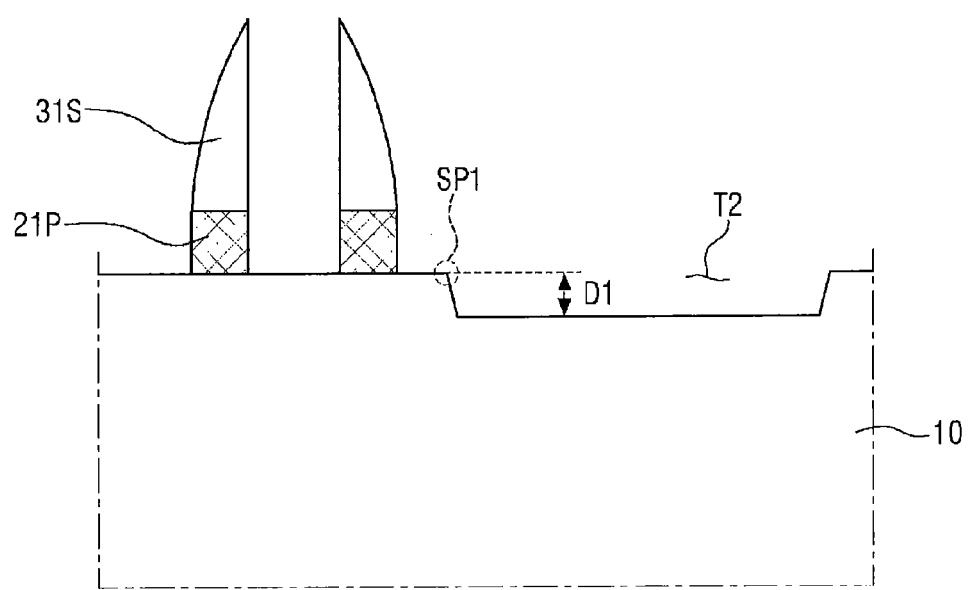

Referring to FIG. 24, the blocking film 40 may then be removed.

Accordingly, the first trench T1 may become a second trench T2 formed within the substrate 10. A depth of the second trench T2 may be the first depth D1.

At this time, a first sharp pattern SP1 may be formed on the portion where the second trench T2 is formed, and on an upper surface of the non-etched substrate. The first sharp pattern SP1 may be a protruding portion formed on a portion that connects an upper surface of the non-etched substrate 10 with the etched second trench T2. An upper surface of the sharp pattern SP' may include a point at which a slope is discontinuous.

Figure 25:
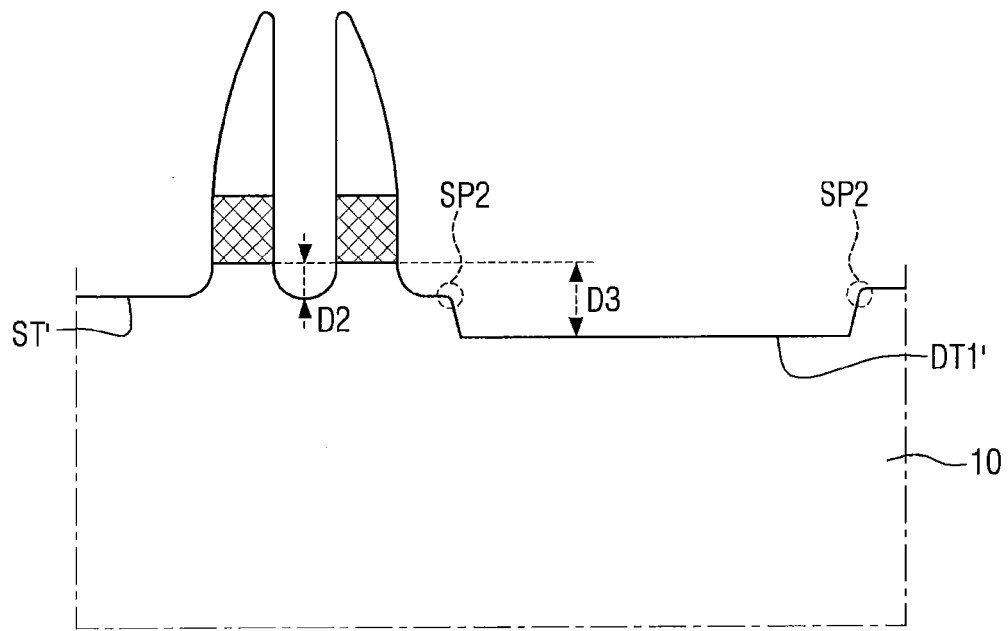

Referring to FIG. 25, the substrate 10 may be etched using the mask pattern 21P as a mask to form a pre-shallow trench ST' and a first pre-deep trench DT1'.

The process of forming the shallow trench ST includes a plurality of processes, rather than one process. Accordingly, the pre-trenches ST', DT1' may first be formed to a predetermined depth as illustrated, and then the oxidation process may be additionally performed to heal defects on the surface of the substrate 10.

Accordingly, the pre-shallow trench ST' may be etched to the second depth D2, and the first pre-deep trench DT1' may be etched to a third depth D3 that is deeper than the second depth D2.

At this time, a second sharp pattern SP2 may be formed on a sidewall of the first pre-deep trench DT1'. The second sharp pattern SP2 may be formed deeper than the first sharp pattern SP1. Like the first sharp pattern SP1, the second sharp pattern SP2 may still include a point at which a slope of an upper surface is discontinuous.

However, since the second sharp pattern SP2 may be subject to more etch process and oxidation process than the first sharp pattern SP1, the surface thereof may be slightly smooth and soft. Further, the spacer pattern 30S may be removed of at least a portion during etch process.

Figure 26:
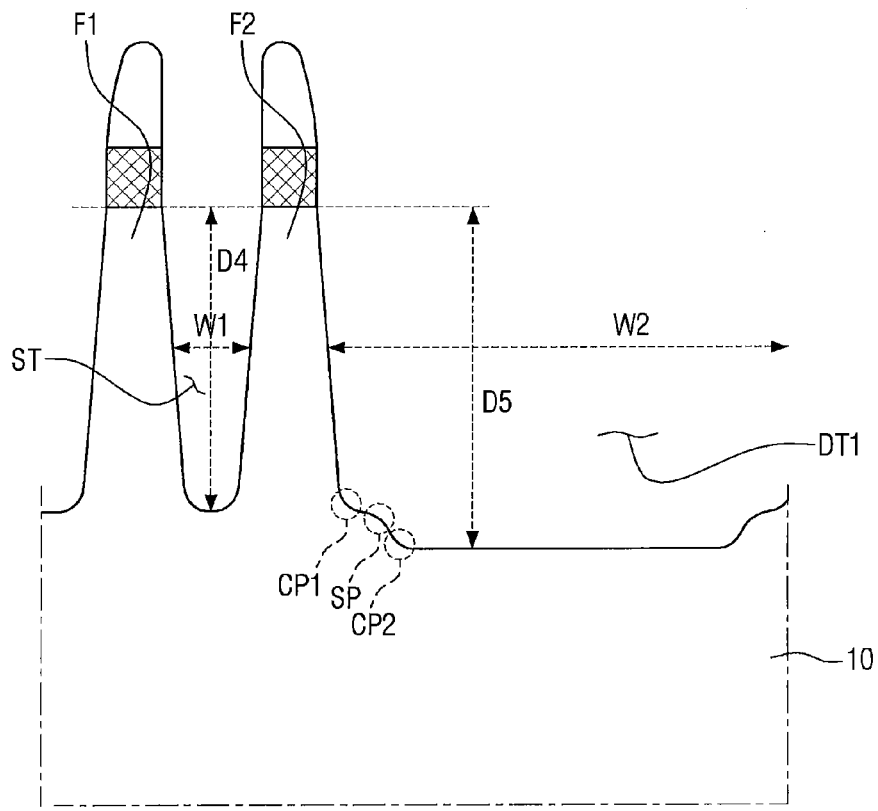

Referring to FIG. 26, the shallow trench ST and the first deep trench DT may be formed, by further increasing a depth of the pre-shallow trench ST and the first pre-deep trench DT1'.

The pre-shallow trench ST' may become the shallow trench ST (also referred to herein as a first trench), as it is further deepened by several etch process and oxidation process as described above. Likewise, the first pre-deep trench DT1' may also become further deepened into the first deep trench DT (also referred to herein as a second trench) as a final form.

The shallow trench ST may have a fourth depth D4 that is deeper than the second depth D2, and the first deep trench DT may have a fifth depth D5 that is deeper than the third depth D3. The fifth depth D5 may be deeper than the fourth depth D4. A width w1 of the shallow trench ST may be less than a width w2 of the first deep trench DT.

According to forming of the shallow trench ST and the first deep trench DT, the first fin-type pattern F1 and the second fin-type pattern F2 may also be formed. A convex-upward smooth pattern SP may be formed between a bottom surface of the first deep trench DT and the second fin-type pattern F2.

The smooth pattern SP may be formed smoother than the second sharp pattern SP2 described above. A slope of the upper surface of the smooth pattern SP may be continuous overall. Further, a first concave portion CP1 and a second concave portion CP2 may be formed on opposite sides of the smooth pattern SP, respectively.

At least a portion of the spacer pattern 30S may be removed by a process of forming the shallow trench ST and the first deep trench DT.

Referring to FIGS. 5 and 6, a device isolating film 155 may be formed in the shallow trench ST and the first deep trench DT, and then the mask pattern 20P may be removed.

Methods for fabricating semiconductor devices according to some example embodiments may form the shallow trench ST and the first deep trench DT together, and thus reduce or minimize waste in the processing, and reduce cost of the fabrication. Furthermore, semiconductor devices can have enhanced reliability by reducing or preventing forming of a ghost fin-type pattern. Furthermore, leakage current of the channel region may be reduced as a width of a lower portion of the fin-type pattern F increases by the smooth pattern SP.

Herein below, methods for fabricating semiconductor devices according to some example embodiments will be described with reference to FIGS. 27 to 32. In the following description, example embodiments of semiconductor devices and the example embodiments of methods for fabricating semiconductor devices of FIGS. 16 to 26 already described above will not be described or will be described briefly for the sake of brevity.

FIGS. 27 to 32 are views illustrating intermediate stages of fabrication, provided to explain semiconductor devices according to some example embodiments.

Figure 27:
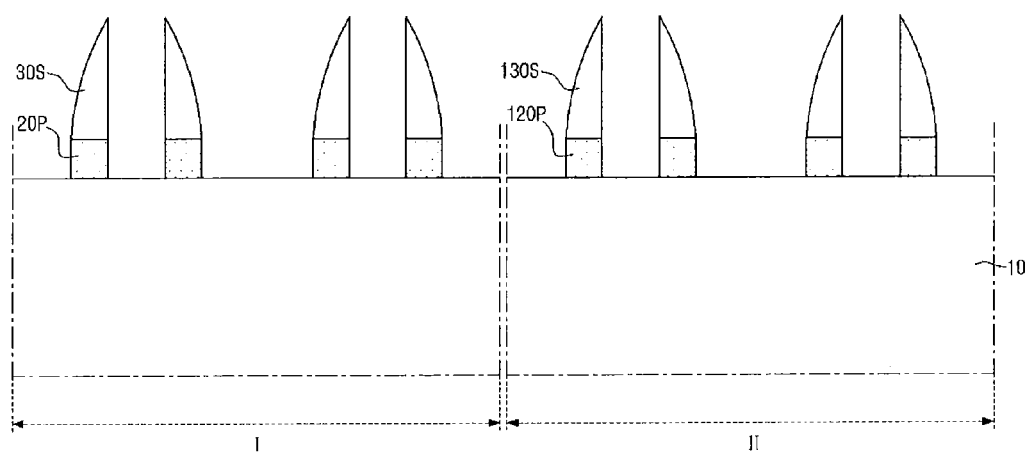
FIGS. 27 to 32 are views illustrating intermediate stages of fabrication, provided to explain semiconductor devices according to some example embodiments.

Referring to FIG. 27, the first spacer pattern 30S and the first mask pattern 20P may be formed in the first region I on the substrate 10, and the second spacer pattern 130S and the second mask pattern 120P may be formed in the second region II.

The process of forming the first spacer pattern 30S, the second spacer pattern 130S, the first mask pattern 20P, and the second mask pattern 120P may be a part of a double-patterning process technology or quadruple-patterning technology. Accordingly, a pitch between respective first spacer pattern 30S and second spacer pattern 130S may be constant or uniform. However, example embodiments are not limited to the example given above.

The first spacer pattern 30S and the second spacer pattern 130S may be formed of silicon oxide, or silicon nitride. The first mask pattern 20P and the second mask pattern 120P may be configured as a plurality of layers. The plurality of layers may each be formed of at least one of silicon-containing material such as silicon oxide (SiOx), silicon oxynitride (SiON), silicon nitride (SixNy), tetra ethyl ortho silicate (TEOS), or polycrystalline silicon, etc., carbon-containing material such as amorphous carbon layer (ACL) or Spin-On Hardmask (SOH), or metal.

Figure 28:
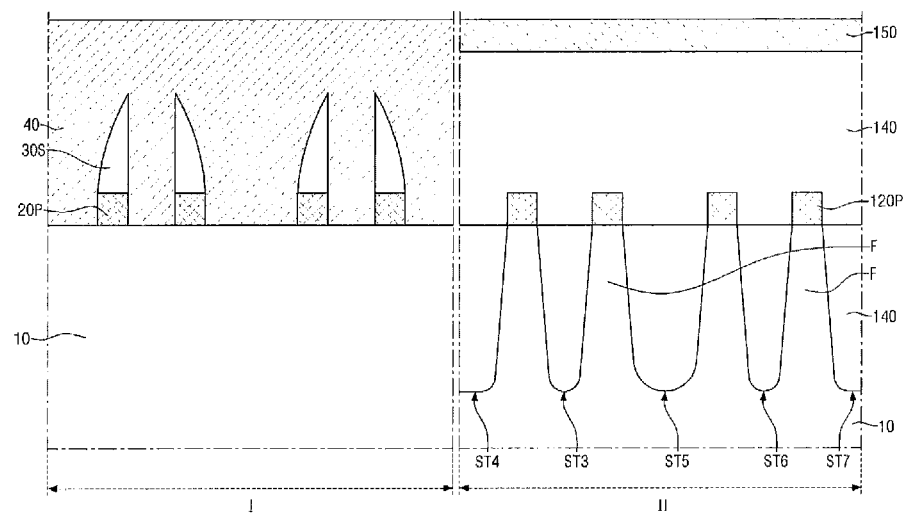

Referring to FIG. 28, third to seventh shallow trenches ST3-ST7 may be formed in the second region II, and a blocking film 40 may be formed in the first region I.

In the second region II, the substrate 10 may be etched using the second mask pattern 120P as a mask to form the third to seventh shallow trenches ST3-ST7. The third to seventh shallow trenches ST3-ST7 may be formed between a plurality of fin-type patterns F. At this time, at least a portion of the second spacer pattern 130S may be removed.

Then, a first device isolating film 140 filling the shallow trenches may be formed. The first device isolating film 140 may extend on or entirely overlay the second mask pattern 120P and the fin-type pattern F.

The blocking film 40 overlaying the mask pattern 20P and the spacer pattern 30S may be formed on the substrate 10 in the first region I. The blocking film 40 may extend on or entirely overlay an upper surface of the substrate 10, a side surface of the mask pattern 20P, and an upper surface and a side surface of the spacer pattern 30S.

Also in the second region II, a second blocking film 150 overlaying the first device isolating film 140 may be formed. The second blocking film 150 may extend on or entirely overlay the upper surface of the first device isolating film 140.

Figure 29:
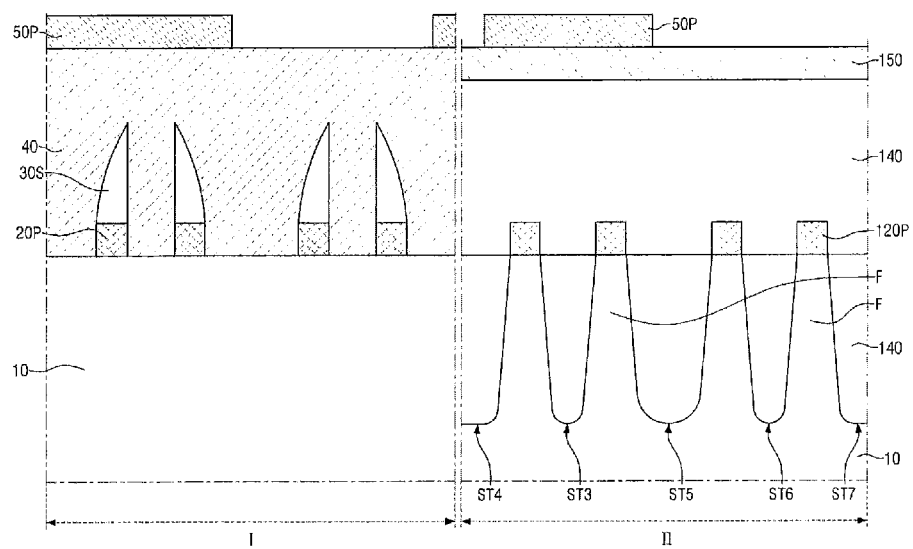

Referring to FIG. 29, a photosensitive film 50 may be formed in the first region I and the second region II.

The photosensitive film 50 may be formed on the first blocking film 40 in the first region I to expose a portion of the first blocking film 40. Further, the photosensitive film 50 may be formed on the second blocking film 150 in the second region II to expose a portion of the second blocking film 150. The photosensitive film 50 may include photoresist (PR). The photosensitive film 50 may be formed for photolithography process.

The photosensitive film pattern 50P may be formed simultaneously in the first region I and the second region II. That is, the photosensitive film pattern 50P may be formed by entirely forming the photosensitive film 50 in the first region I and the second region II, and entirely patterning the same. Patterning the photosensitive film 50 may include a process of partially or entirely exposing the first region I and the second regions II.

At this time, the first spacer patterns 30S may include real spacer patterns 31S and dummy spacer patterns 32S. That is, of the first spacer patterns 30S, the first spacer patterns 30S overlapping with the photosensitive film pattern 50P may be classified as real spacer patterns 31S. In contrast, of the first spacer patterns 30S, the first spacer patterns 30S not overlapping with the photosensitive film pattern 50P may be classified as dummy spacer patterns 32S.

Further, the first mask patterns 20P may be classified into real mask patterns 21P and dummy mask patterns 22P. That is, of the first mask patterns 20P, the first mask patterns 20P overlapping with the photosensitive film pattern 50P may be classified as real mask patterns 21P. In contrast, of the first mask patterns 20P, the first mask patterns 20P not overlapping with the photosensitive film 50 may be classified as dummy mask patterns 22P.

In the second region II, the first fin-type pattern F may be classified into real fin-type patterns F and dummy fin-type patterns F. That is, of the fin-type patterns F, the fin-type patterns F overlapping with the photosensitive film pattern 50P may be classified as real fin-type patterns F. In contrast, of the fin-type patterns F, the fin-type patterns F not overlapping with the photosensitive film 50 may be classified as dummy fin-type patterns F.

Figure 30:
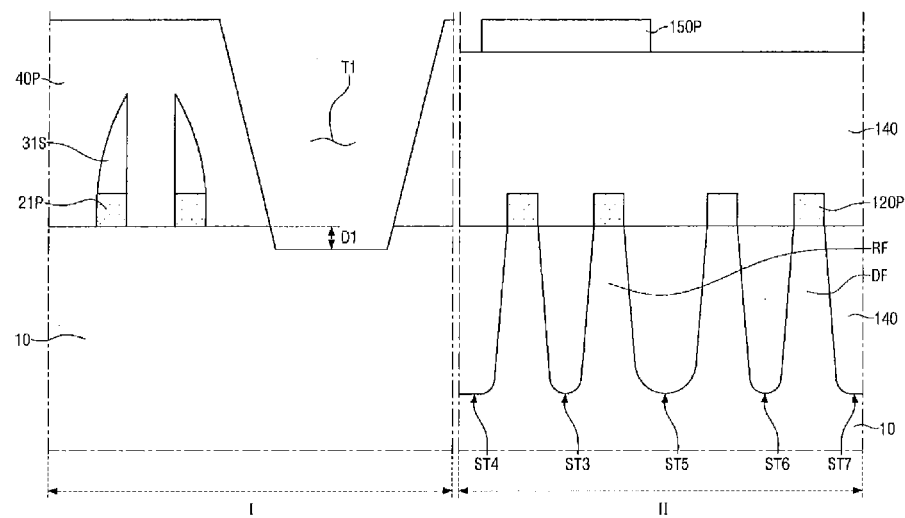

Referring to FIG. 30, a portion of the first blocking film 40, the dummy spacer pattern 32S, and the dummy mask pattern 22P may be removed in the first region I, and the second blocking film 150 may be patterned along the photosensitive film pattern 50P in the second region II.

According to the removal of the portion of the blocking film 40 exposed by the photosensitive film pattern 50P, the dummy spacer pattern 32S, and the dummy mask pattern 22P, a first trench T1 may be formed. According to the removal of the portion of the exposed first blocking film 40, the dummy spacer pattern 32S, and the dummy mask pattern 22P, a portion of the substrate 10 may be etched. As a result, the upper surfaces of the substrate 10 may be lowered slightly. Accordingly, a bottom surface of the first trench T1 may be lowered by a first depth D1, compared to a portion where the first blocking film 40 is not removed.

At this time, the first blocking film 40, the dummy spacer pattern 32S, and the dummy mask pattern 22P may be removed in a sequential order, or at once. That is, the manners in which the first blocking film 40, the dummy spacer pattern 32S, and the dummy mask pattern 22P are removed are not limited to any specific example.

Figure 31:
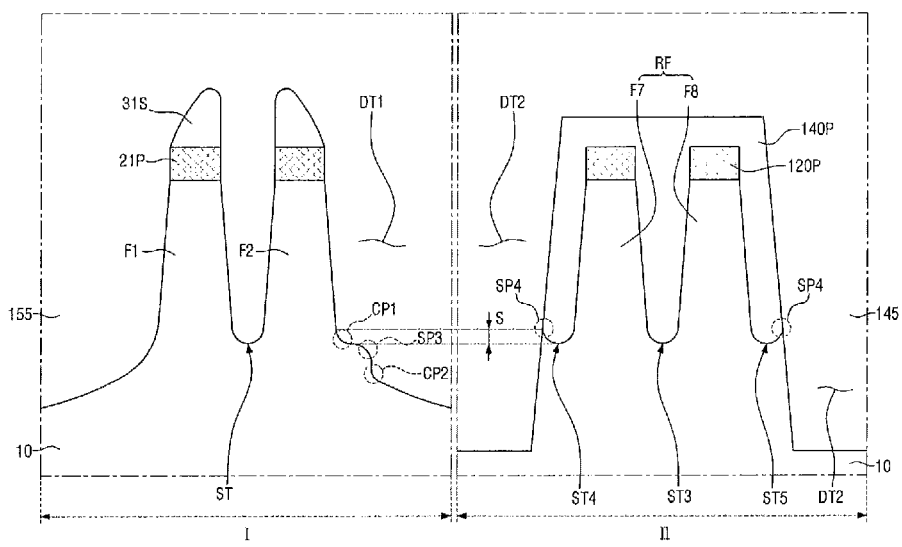

Referring to FIG. 31, the substrate 10 is etched using the first mask pattern 20P as a mask to form the shallow trench ST and the first deep trench DT1 in the first region I, and the dummy fin-type pattern F is removed to form the second deep trench DT2 in the second region II.

According to forming of the shallow trench ST and the first deep trench DT1 in the first region I, the first fin-type pattern F1 and the second fin-type pattern F2 may also be formed. A convex-upward smooth pattern SP3 may be formed between a bottom surface of the first deep trench DT1 and the second fin-type pattern F2.

The smooth pattern SP3 may be formed smoother than the second sharp pattern SP2 described above. A slope of the upper surface of the smooth pattern SP3 may be continuous overall. Further, a first concave portion CP1 and a second concave portion CP2 may be formed on opposite sides of the smooth pattern SP3, respectively.

At least a portion of the spacer pattern 30S may be removed by a process of forming the shallow trench ST and the first deep trench DT1.

In the second region II, the sixth shallow trench ST6 and the seventh shallow trench ST7 may be removed together with the dummy fin-type pattern F. The fourth shallow trench ST4 and the fifth shallow trench ST5 may be partially removed.

The real fin-type patterns F in the second region II may include the seventh fin-type pattern F7 and the eighth fin-type patterns F8.

The second deep trench DT2 in the second region II may be formed deeper than the first deep trench DT1 in the first region I. The shallow trench ST in the first region I may have a same depth as the third and fourth shallow trenches ST3, ST4 in the second region II. The term "same" depth as used herein may refer to concept that includes a depth formed by an etch process performed at different time points from each other, but in the same manner as each other, and may include a fine stepped portion of a depth according to same process.

The sharp pattern SP4 may be formed in the second region II. The sharp pattern SP4 may be formed between the second deep trench DT2 and the fourth shallow trench ST4. The sharp pattern SP4 may be formed between the second deep trench DT2 and the fifth shallow trench ST5.

An upper surface of the sharp pattern SP4 may include a point at which a slope of the upper surface is discontinuous. That is, the sharp pattern SP4 may include a sharp and raised portion. The upper surface of the sharp pattern SP4 may be higher than an upper surface of the smooth pattern SP3 in the first region I. A height of an uppermost portion of the sharp pattern SP4 may be formed a predetermined height S higher than an uppermost portion of the smooth pattern SP3.

Figure 32:
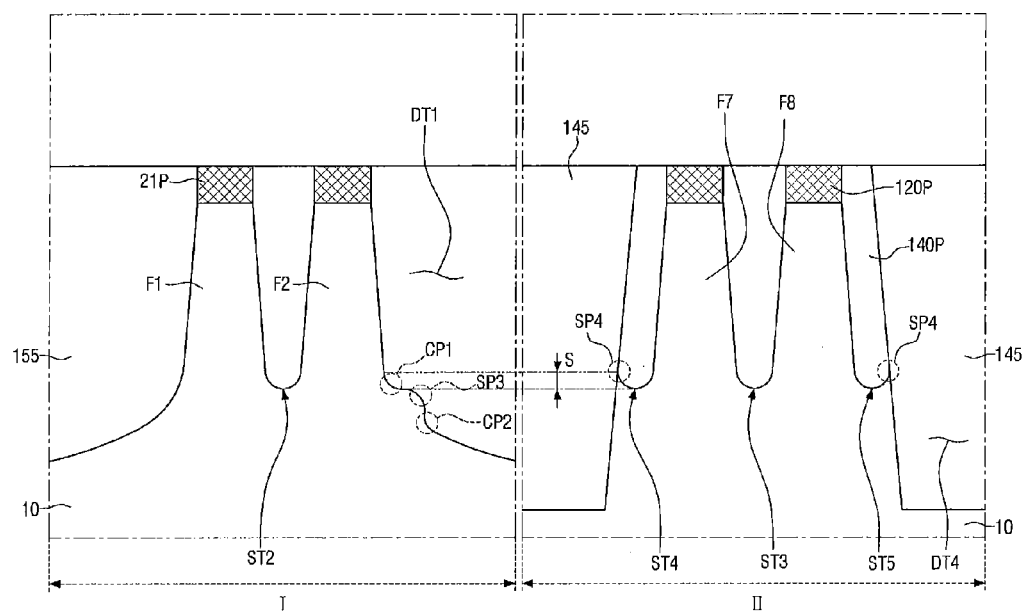

Referring to FIG. 32, the device isolating film 155 may be formed in the first region I, and the second device isolating film 145 may be formed in the second region II.

Then, planarization process may be performed using the first mask pattern 20P and the second mask pattern 120P as an etch-stop film. Accordingly, upper surfaces of the first mask pattern 20P, the second mask pattern 120P, the device isolating film 155, the first device isolating film 140P, and/or the second device isolating film 145 may have same planes (i.e., may be coplanar).

Referring FIG. 12, the first mask pattern 20P and the second mask pattern 120P may be removed to expose the upper portions of the first and second fin-type patterns F1, F2 and the seventh and eighth fin-type patterns F7, F8. Then, a gate electrode may be formed on the device isolating film 155, the first device isolating film 140P, and the second device isolating film 145.

While the present inventive concepts has been particularly shown and described with reference to example embodiments thereof, it will be understood by those of ordinary skill in the art that various changes in form and details may be made therein without departing from the spirit and scope of the present inventive concepts as defined by the following claims. It is therefore desired that the present embodiments be considered in all respects as illustrative and not restrictive, reference being made to the appended claims rather than the foregoing description to indicate the scope of the inventive concepts.

What is claimed is:

1. A method for fabricating a semiconductor device, the method comprising:
    forming a plurality of mask patterns comprising a real mask pattern and a dummy mask pattern on a semiconductor substrate of the semiconductor device;
    removing the dummy mask pattern, wherein removing the dummy mask pattern forms a preliminary trench in the semiconductor substrate; and then
    etching the semiconductor substrate using the real mask pattern as a mask to form a first trench, a second trench having a depth greater than the first trench, and a fin-type pattern defined by the first trench and the second trench;
    wherein the second trench contacts the fin-type pattern and comprises a smooth pattern which is convex and is positioned between a bottom surface and a side surface of the second trench, a first concave portion which is positioned between the side surface of the second trench and the smooth pattern, and a second concave portion which is positioned between the smooth pattern and the bottom surface of the second trench.

2. The method of claim 1, wherein an upper surface of the smooth pattern is lower than a bottom surface of the first trench.

3. The method of claim 1, wherein a slope of a surface of the smooth pattern is continuous.

4. The method of claim 1, wherein a width of the first trench is less than a width of the second trench.

5. The method of claim 1, wherein the plurality of mask patterns are spaced apart from one another by a predetermined pitch.

6. The method of claim 1, wherein forming the first trench and the second trench comprises:
    first etching the semiconductor substrate to form a pre-first trench; and
    second etching a bottom surface of the pre-first trench more deeply to form the first trench.

7. The method of claim 1, further comprising conformally forming a first liner comprising a polysilicon on the fin-type pattern.

8. The method of claim 7, further comprising, before forming the first liner, conformally forming a second liner comprising an oxide film on a surface of the fin-type pattern.

9. The method of claim 1, wherein the first trench and the second trench are formed simultaneously.

10. A method for fabricating a semiconductor device, the method comprising:
    forming a mask pattern having a predetermined pitch on a semiconductor substrate of the semiconductor device, wherein the mask pattern comprises a real mask pattern and a dummy mask pattern;
    removing the dummy mask pattern to form a pre-second trench in the semiconductor substrate and a sharp pattern in the semiconductor substrate and protruding therefrom between the pre-second trench and the real mask pattern; and then
    etching the semiconductor substrate using the real mask pattern as a mask to form a first trench, a second trench formed by increasing a depth of the pre-second trench, and a smooth pattern formed by increasing a smoothness of a surface of the sharp pattern, wherein the smooth pattern is convex and is positioned between a bottom and a side surface of the second trench.

11. The method of claim 10, wherein a height of an upper surface of the sharp pattern is higher than, or same as an upper surface of the smooth pattern.

12. The method of claim 10, wherein removing the dummy mask pattern is performed without removing portions of the semiconductor substrate exposed by the real mask pattern, and wherein etching the semiconductor substrate to form the first trench, and forming the second trench by increasing a depth of the pre-second trench are performed simultaneously.

13. The method of claim 10, wherein forming the first trench and the second trench comprises forming a fin-type pattern defined by the first trench and the second trench, and the method further comprises forming a device isolating film filling at least a portion of the first trench and at least a portion of the second trench.

14. The method of claim 13, wherein forming the device isolating film comprises:
    forming the device isolating film entirely filling the first trench and the second trench, and removing a portion of the device isolating film to expose an upper portion of the fin-type pattern.

15. The method of claim 14, further comprising, before removing the portion of the device isolating film, annealing the device isolating film to cause the fin-type pattern to be inclined to one side.

16. The method of claim 10, wherein forming the first trench and the second trench comprises:
forming a fin-type pattern defined by the first trench and the second trench, and
forming the smooth pattern comprises:
forming a first concave portion which is between the fin-type pattern and the smooth pattern, and a second concave portion which is between the bottom of the second trench and the smooth pattern.

17. A method of fabricating a semiconductor device, the method comprising:
forming mask patterns on a semiconductor substrate of the semiconductor device;
performing an etch process comprising:
selectively removing at least one of the mask patterns to define a preliminary trench in the semiconductor substrate adjacent remaining ones of the mask patterns without removing the semiconductor substrate therebetween, wherein edges of the preliminary trench define sharp patterns in the semiconductor substrate and protruding therefrom; and then
etching the semiconductor substrate between the remaining ones of the mask patterns to define fin-type patterns protruding from the semiconductor substrate and a shallow trench therebetween, wherein the etching dulls the sharp patterns and increases a depth of the preliminary trench to define a deep trench in the semiconductor substrate adjacent one of the fin-type patterns; and
responsive to performing the etch process, forming device isolating patterns in the shallow trench and in the deep trench.

18. The method of claim 17, wherein, responsive to performing the etch process, a portion of the semiconductor substrate between a sidewall of the one of the fin-type patterns and a bottom surface of the deep trench defines a convex pattern.

19. The method of claim 18, wherein, responsive to performing the etch process, a portion of the semiconductor substrate between the sidewall of the one of the fin-type patterns and the convex pattern defines a first concave pattern, and wherein a portion of the semiconductor substrate between the convex pattern and the bottom surface of the deep trench defines a second concave pattern.

20. The method of claim 19, wherein the etching the semiconductor substrate between the remaining ones of the mask patterns comprises:
performing a first etch to define a preliminary shallow trench between the remaining ones of the mask patterns and to increase the depth of the preliminary trench to define a preliminary deep trench having the sharp patterns dulled at edges thereof; and then
performing a second etch to increase respective depths of the preliminary shallow trench and the preliminary deep trench to define the shallow trench and the deep trench, respectively, such that the deep trench comprises the first concave pattern, the convex pattern, and the second concave pattern in the portions of the semiconductor substrate, respectively.

21. The method of claim 19, wherein, responsive to performing the etch process, the shallow trench between the fin-type patterns is free of a convex pattern.

22. The method of claim 18, wherein the mask patterns comprise first mask patterns on a first region of the semiconductor substrate, wherein the fin-type patterns and the shallow trench comprise first fin-type patterns and a first shallow trench, respectively, and further comprising the following prior to performing the etch process:
forming second mask patterns on a second region of the semiconductor substrate adjacent the first region, wherein the first and second mask patterns are spaced with a uniform pitch therebetween;
selectively etching the second region of the semiconductor substrate using the second mask patterns as a mask to define second fin-type patterns therein having a second shallow trench therebetween; and
forming a first device isolating film in the second shallow trench,
wherein the second shallow trench has a same depth as the first shallow trench.

23. The method of claim 22, wherein the deep trench comprises a first deep trench in the first region of the semiconductor substrate, and further comprising:
forming a second deep trench in the second region of the semiconductor substrate adjacent one of the second fin-type patterns such that a portion of the semiconductor substrate between a sidewall of the one of the second fin-type patterns and a bottom surface of the second deep trench defines a sharp pattern; and
forming a second device isolating film on the sharp pattern in the second deep trench,
wherein the second deep trench has a greater depth than the first deep trench, and
wherein the sharp pattern protrudes away from the bottom surface of the second deep trench and beyond the convex pattern.

24. The method of claim 17, wherein the device isolating patterns in the shallow trench and the deep trench comprise portions of a same low-k device isolating film.

* * * * *